United States Patent
Kotani et al.

(10) Patent No.: US 7,796,368 B2
(45) Date of Patent: Sep. 14, 2010

(54) HIGH-FREQUENCY POWER SUPPLY SYSTEM

(75) Inventors: Hiroyuki Kotani, Osaka (JP); Hirotaki Takei, Osaka (JP); Yoshifumi Ibuki, Osaka (JP); Hiroaki Oichi, Osaka (JP)

(73) Assignee: DAIHEN Corporation, Osaka (JP)

( * ) Notice: Subject to any disclaimer, the term of this patent is extended or adjusted under 35 U.S.C. 154(b) by 936 days.

(21) Appl. No.: 10/580,815

(22) PCT Filed: Nov. 26, 2004

(86) PCT No.: PCT/JP2004/017595
§ 371 (c)(1),
(2), (4) Date: May 25, 2006

(87) PCT Pub. No.: WO2005/057993
PCT Pub. Date: Jun. 23, 2005

(65) Prior Publication Data
US 2007/0121267 A1 May 31, 2007

(30) Foreign Application Priority Data
Nov. 27, 2003 (JP) ............................. 2003-396740
Mar. 24, 2004 (JP) ............................. 2004-086968

(51) Int. Cl.
*H02H 3/00* (2006.01)
(52) U.S. Cl. ........................................................ 361/82
(58) Field of Classification Search .................... 361/82
See application file for complete search history.

(56) References Cited
U.S. PATENT DOCUMENTS
5,830,310 A 11/1998 Doi 6,311,638 B1 * 11/2001 Ishii et al. ............ 118/723 MW
7,301,286 B2 * 11/2007 Kuriyama ..................... 315/150

(Continued)

FOREIGN PATENT DOCUMENTS
EP 1 441 576 7/2004

(Continued)

OTHER PUBLICATIONS
Machine English Translation of JP 2003-173973.*

*Primary Examiner*—Robert DeBeradinis
*Assistant Examiner*—Scott Bauer
(74) *Attorney, Agent, or Firm*—Hamra, Schumann, Mueller & Larson, P.C.

(57) ABSTRACT

A high-frequency power supply system includes an anomaly detector 3 which detects an anomaly occurring in a circuit on the side of a load L as from an outputting end A of a high-frequency power source 1. The anomaly detector 3 includes a first detector 21 which detects a voltage value Vf of a high-frequency forward wave, a second detector 22 which detects a voltage value Vr of a high-frequency reflected wave, a reflection coefficient calculator 23 and a differentiator 24 which calculate a reflection coefficient differential value $d\Gamma/dt$ from the forward wave voltage value Vf and the reflected wave voltage value Vr, and an anomaly determiner 25 which determines of an occurrence of an anomaly based on the reflection coefficient differential value $d\Gamma/dt$. When the anomaly detector 3 outputs an anomaly detection signal to the high-frequency power source 1, high-frequency power source 1 stops its power output operation.

44 Claims, 23 Drawing Sheets

U.S. PATENT DOCUMENTS

2002/0188367 A1* 12/2002 Hayashi .................. 700/110

FOREIGN PATENT DOCUMENTS

| | | |
|---|---|---|
| JP | 4-368799 | 12/1992 |
| JP | 8-193271 | 7/1996 |
| JP | 2000-299198 | 10/2000 |
| JP | 2002-151475 | 5/2002 |
| JP | 2003-173973 | 6/2003 |
| WO | WO 03/037047 | 5/2003 |

* cited by examiner

HIGH-FREQUENCY POWER SUPPLY SYSTEM

TECHNICAL FIELD

The present invention relates to a high-frequency power supply system for supplying high-frequency electric power to a load, such as a plasma processing apparatus, via an impedance matching unit.

BACKGROUND ART

FIG. 23 shows a general configuration of a conventional high-frequency power supply system. The power supply system includes a high-frequency power source 51 to output high-frequency power, an impedance matching unit 53 for matching the input impedance of the high-frequency power source 51 with the load impedance, and a load L which is e.g. a plasma processing apparatus. The impedance matching unit 53 is connected with the high-frequency power source 51 via a transmission line 52 provided by a coaxial cable. The load L is connected with the impedance matching unit 53 via a load connecting section 54 consisting of e.g. copper plates and shielded to prevent electromagnetic leakage.

The high-frequency power source 51 is an apparatus for supplying the load L with high-frequency electric power. The high-frequency power source 51 includes unillustrated components such as a power amplification circuit and an oscillation circuit, and outputs high-frequency power of a predetermined electric power to the impedance matching unit 53 via the transmission line 52.

The impedance matching unit 53 matches the input impedance, i.e. an impedance viewed from the matching unit's inputting end toward the high-frequency power source 51, with the load impedance, i.e. an impedance viewed from the matching unit's inputting end toward the load L. The impedance matching unit 53 improves efficiency in supplying the output from the high-frequency power source 51 to the load L. The load L is an apparatus for processing works such as semiconductor wafers and liquid crystal substrates by means of etching, CVD, etc.

In the above-described high-frequency power supply system, the load L fluctuates while the load L is supplied with the high-frequency power from the high-frequency power source 51, resulting in unmatched impedance between the high-frequency power source 51 and the load L. In the high-frequency power supply system therefore, impedance matching between the high-frequency power source 51 and the load L is performed by automatically varying the impedance value of a variable impedance device (not illustrated) incorporated in the impedance matching unit 53 following the fluctuation of the load L.

Now, the high-frequency power supply system being as such, imagine that the load L is provided by a plasma processing apparatus and that a gas pressure change, an electric discharge temperature increase, etc. has triggered an arcing, an insulation breakdown or other abnormal state which causes abrupt impedance change of the load L. When this happens, the high-frequency power supply system or the impedance matching unit 53 can no longer catch up sufficiently in its impedance matching operation, and sometimes it becomes impossible to match the impedances. In such a case of unmatched impedance, a high-frequency power wave which is reflected back to the high-frequency power source 51 becomes very big, to damage the high-frequency power source 51. Meanwhile in the load L, the damaged component can be destroyed further by continued supply of the high frequency power.

In the high-frequency power supply system, unmatched impedance also occurs in the connection line between the high-frequency power source 51 and the load L if there is poor insulation, broken insulation, poor contact in a connector or other abnormal situation in the transmission line 52, the impedance matching unit 53, etc. Once this happens, a power wave which is reflected back to the high-frequency power source 51 becomes very big in the high-frequency power supply system, to damage the high-frequency power source 51 or exacerbate damage in the component where the abnormal situation originated.

Once such an anomaly occurs, it is desirable that some safety function takes place; for example the supply of high-frequency power may be stopped immediately. However, the conventional high-frequency power supply system is not designed to detect such an anomaly as described above or run a safety function.

In the field of high-frequency wave technology, parameters such as reflection coefficient and return loss are known as indicators of power supply efficiency to the load. By using these parameters it is possible to detect a reflected power wave which can damage the high-frequency power source 51. Based on this, it is possible as disclosed in e.g. JP-A 2000-299198 Gazette to monitor the status of the load by using the reflection coefficient $\Gamma$, to detect abnormalities by checking e.g. if the reflection coefficient is greater than a predetermined reference value, and to run a safety function.

However, a problem with this method is that the reflection coefficient should exceed the reference value in order for the anomaly to be recognized. Thus, there can be a situation where the reflection coefficient has changed and an anomaly has already occurred in the load yet the system has not determined that the situation is abnormal. In other words, this method does not have sufficient response for safety purposes. For example, see FIG. 24 and FIG. 25 which show time-course changes of a reflection coefficient. FIG. 24 shows a case where there is an abnormal, instantaneous surge in the reflection coefficient within a range not exceeding the reference value. FIG. 25 shows a case where there is a series of intermittent surges in the reflection coefficient within a range not exceeding the reference value. In such cases as shown in FIG. 24 and FIG. 25, the abnormalities are not detected even if they exist in the load as a result of change in the reflection coefficient. Further, the abnormalities will not be detected until they have grown to an extent that the reflection coefficient is greater than the reference value. Thus, the method is not adequate as a method for safety functions.

DISCLOSURE OF THE INVENTION

It is therefore an object of the present invention to provide a high-frequency power supply system which is capable of solving or reducing the above-described problems in the conventional art.

A first aspect of the present invention provides a high-frequency power supply system for supplying high-frequency power from a high-frequency power source to a load via an impedance matching unit. The system includes: a first detector for detecting information about a forward wave traveling from the high-frequency power source toward the load; a second detector for detecting information about a reflected wave traveling from the load toward the high-frequency power source; a differentiator for calculating the change of the magnitude of reflection coefficient per unit time at a detection point provided for the first and the second detector based on the information about the forward wave detected by the first detector and the information about the reflected wave detected by the second detector; and anomaly determiner for determining an occurrence of an anomaly on a side toward the load as from the detection point provided for the first and the second detector based on the change of the magnitude of reflection coefficient per unit time calculated by the differentiator.

Preferably, the anomaly determiner determines the occurrence of anomaly when the change of the magnitude of reflection coefficient per unit time exceeds a first predetermined reference value.

Preferably, the anomaly determiner includes a counter for counting the number of times when the change of the magnitude of reflection coefficient per unit time exceeds a first predetermined reference value, and determines the occurrence of anomaly when the number of times counted by the counter exceeds a predetermined norm number.

Preferably, the high-frequency power supply system further includes a calculator for calculating the magnitude of reflection coefficient at the detection point provided for the first and the second detector based on the information about the forward wave detected by the first detector and the information about the reflected wave detected by the second detector. The anomaly determiner determines the occurrence of anomaly on the side toward the load as from the detection point of the first and the second detector based on the change of the magnitude of reflection coefficient per unit time calculated by the differentiator and the magnitude of reflection coefficient calculated by the calculator.

According to the above configuration, the following will take place: Specifically, while the high-frequency power source supplies the load with high-frequency power via the impedance matching unit, detection is made for a power value, a voltage value and so on, i.e. information about the forward wave (hereinafter called forward-wave information) and about the reflected wave (hereinafter called reflected-wave information) at any desired detection point inside the high-frequency power source, in the transmission line from the high-frequency power outputting end of the high-frequency power source to the high-frequency power inputting end of the impedance matching unit, or inside the impedance matching unit. Then, based on the forward-wave information and the reflected-wave information, a change of the magnitude of reflection coefficient $\Gamma$ per unit time (hereinafter called reflection coefficient differential value $d\Gamma/dt$) is calculated.

Then, based on the reflection coefficient differential value $d\Gamma/dt$, determination is made on an occurrence of an anomaly on the side of the circuit toward the load as from the detection point of the forward-wave information and reflected-wave information. For example, an occurrence of anomaly on the side of the circuit toward the load as from the detection point of the forward-wave information and reflected-wave information is affirmed when the reflection coefficient differential value $d\Gamma/dt$ has exceeded a first predetermined reference value. As another example, an occurrence of anomaly on the side of the circuit toward the load as from the detection point of the forward-wave information and the reflected-wave information is affirmed when the reflection coefficient differential value $d\Gamma/dt$ has exceeded a first predetermined reference value more times than a predetermined norm number.

As described, the determination on an occurrence of anomaly on the side of the circuit toward the load as from the detection point of the forward-wave information and reflected-wave information is based on the reflection coefficient differential value $d\Gamma/dt$. Therefore, it is possible to make an anomaly determination within a quickest possible time even under situations shown in FIG. 24 and FIG. 25 for example, where an anomaly is caused by an instantaneous surge of the reflection coefficient or by a series of intermittent surges of the reflection coefficient.

Preferably, the anomaly determiner determines the occurrence of anomaly when the magnitude of reflection coefficient exceeds a second predetermined reference value and the change of the magnitude of reflection coefficient per unit time exceeds a first predetermined reference value.

Preferably, the anomaly determiner includes: a first counter for counting the number of times when the change of the magnitude of reflection coefficient per unit time exceeds a first predetermined reference value; and a second counter for counting the number of times when the magnitude of reflection coefficient exceeds a second predetermined reference value. The anomaly determiner determines the occurrence of anomaly when the number of times counted by the first counter exceeds a first predetermined norm number and the number of times counted by the second counter exceeds a second predetermined norm number.

Preferably, the detection point provided for the first and the second detector is inside the high-frequency power source, in a transmission line from a high-frequency power outputting end of the high-frequency power source to a high-frequency power inputting end of the impedance matching unit, or inside the impedance matching unit.

According to the above configuration, while the high-frequency power source supplies the load with high-frequency power via the impedance matching unit, detection is made for forward-wave information and reflected-wave information. Based on the forward-wave information and the reflected-wave information, the magnitude of the reflection coefficient $\Gamma$ and the reflection coefficient differential value $d\Gamma/dt$ are calculated. Then, based on the magnitude of the reflection coefficient $\Gamma$ and the reflection coefficient differential value $d\Gamma/dt$, determination is made on an occurrence of an anomaly on the side of the circuit toward the load as from the detection point of the forward-wave information and reflected-wave information.

For example, determination is made on an occurrence of an anomaly on the side of the circuit toward the load as from the detection point, which is a location selected inside the high-frequency power source, in the transmission line from the high-frequency power outputting end of the high-frequency power source to the high-frequency power inputting end of the impedance matching unit or inside the impedance matching unit, when the magnitude of the reflection coefficient $\Gamma$ has exceeded a second predetermined reference value and the reflection coefficient differential value $d\Gamma/dt$ has exceeded a first predetermined reference value. As another example, an occurrence of anomaly on the side of the circuit toward the load as from the detection point in the transmission line is affirmed when the magnitude of the reflection coefficient $\Gamma$ has exceeded the second reference value more times than a second predetermined norm number and the reflection coefficient differential value $d\Gamma/dt$ has exceeded the first reference value more times than a first predetermined norm number.

As described, anomaly occurrence determination is made for the side of the circuit toward the load as from any desired detection point in the transmission line based not only on the reflection coefficient differential value $d\Gamma/dt$ but also on the magnitude of reflection coefficient $\Gamma$, which improves accuracy in the above-described anomaly detection.

A second aspect of the present invention provides a high-frequency power supply system for supplying high-frequency power from a high-frequency power source to a load via an impedance matching unit. The system includes: first detector for detecting information about a forward wave traveling from the high-frequency power source toward the load; second detector for detecting information about a reflected wave traveling from the load toward the high-frequency power source; first differentiator for calculating a change per unit time of a magnitude of reflection coefficient at a detection point provided for the first and the second detector based on the information about the forward wave detected by the first detector and the information about the reflected wave detected by the second detector; third detector for detecting an input voltage to the load; fourth detector for detecting an input current to the load; second differentiator for calculating the change of the magnitude of impedance per unit time as viewed from a detection point provided for the third and the fourth detector toward the load based on the input voltage detected by the third detector and the input current detected by the fourth detector; and anomaly determiner for determining an occurrence of an anomaly on a side toward the load as from the detection point provided for the third and the fourth detector based on the change of the magnitude of reflection coefficient per unit time calculated by the first differentiator and the change of the magnitude of impedance per unit time calculated by the second differentiator.

Preferably, the anomaly determiner determines the occurrence of anomaly when the change of the magnitude of reflection coefficient per unit time exceeds a first predetermined reference value and the change of the magnitude of impedance per unit time exceeds a third predetermined reference value.

Preferably, the anomaly determiner includes: first counter for counting the number of times when the change of the magnitude of reflection coefficient per unit time exceeds a first predetermined reference value; a third counter for counting the number of times when the change of the magnitude of impedance per unit time exceeds a third predetermined reference value. The anomaly determiner determines the occurrence of anomaly when the number of times counted by the first counter exceeds a first predetermined norm number and the number of times counted by the third counter exceeds a third predetermined norm number.

According to the above configuration, the following will take place: Specifically, while the high-frequency power source supplies the load with high-frequency power via the impedance matching unit, detection is made for a power value, a voltage value and so on, i.e. forward-wave information and reflected-wave information at any desired detection point inside the high-frequency power source, in the transmission line from the high-frequency power outputting end of the high-frequency power source to the high-frequency power inputting end of the impedance matching unit, or inside the impedance matching unit. Then, based on the forward-wave information and the reflected-wave information, the reflection coefficient differential value $d\Gamma/dt$ is calculated.

Meanwhile, detection is made in the transmission line from inside the impedance matching unit to the load, for an input voltage and an input current to the load. Based on these input voltage and input current, calculation is made for a change of the magnitude of impedance Z per unit time (hereinafter called differential value $dZ/dt$ of the impedance Z).

Then, based on the reflection coefficient differential value $d\Gamma/dt$ of the reflection coefficient $\Gamma$ and the differential value $dZ/dt$ of the impedance Z, determination is made on an occurrence of an anomaly on the load side. For example, an occurrence of anomaly on the load side is affirmed when the differential value $d\Gamma/dt$ of the reflection coefficient $\Gamma$ has exceeded a first predetermined reference value and the differential value $dZ/dt$ of the impedance Z has exceeded a third predetermined reference value. As another example, an occurrence of an anomaly on the load side is affirmed when the differential value $d\Gamma/dt$ of the reflection coefficient $\Gamma$ has exceeded a first predetermined reference value more times than a first predetermined norm number and the differential value $dZ/dt$ of the impedance Z has exceeded a third predetermined reference value more times than a third predetermined norm number.

As described, use of the differential value $d\Gamma/dt$ of the reflection coefficient $\Gamma$ and the differential value $dZ/dt$ of the impedance Z in the detection of anomalies enables reliable detection of anomalies on the side of load L. Specifically, an anomaly occurrence in the circuit toward the load as from an outputting end of the high-frequency power source is detectable by obtaining the differential value $d\Gamma/dt$ of the reflection coefficient $\Gamma$; however, it is difficult to specifically identify anomalies occurring only in the load from the differential value $d\Gamma/dt$ of the reflection coefficient $\Gamma$ alone, because the circuit from the outputting end of the high-frequency power source to the load contains the transmission line and the impedance matching unit. On the other hand, it is difficult to detect anomalies in the load by measuring the impedance Z alone at an inputting end of the load because impedance in the load will fluctuate more or less while the load is processing a work and so the measurement will not give a reliable reference value for anomaly determination. Thus, according to the present invention, not only the differential value $d\Gamma/dt$ of the reflection coefficient $\Gamma$ but also the differential value $dZ/dt$ of the impedance Z are obtained, whereby anomalies happening specifically within the load are detected reliably.

The third reference value for the change of the magnitude of impedance per unit time may be smaller or greater than a normal value. If a value smaller than the normal value is selected for the third reference value, the time when the calculated value exceeds the third reference value is the time when the calculated value has become smaller than the third reference value. Likewise, if a value greater than the normal value is selected for the third reference value, the time when the calculated value exceeds the third reference value is the time when the calculated value has become greater than the third reference value.

Preferably, the high-frequency power supply system further includes calculator for calculating a magnitude of reflection coefficient at the detection point provided for the first and the second detector based on the information about the forward wave detected by the first detector and the information about the reflected wave detected by the second detector. The anomaly determiner determines the occurrence of anomaly on the side toward the load as from the detection point of the third and the fourth detector based on the change of the magnitude of reflection coefficient per unit time calculated by the first differentiator, the magnitude of reflection coefficient calculated by the calculator and the change of the magnitude of impedance per unit time calculated by the second differentiator.

Preferably, the anomaly determiner determines the occurrence of anomaly when the change of the magnitude of reflection coefficient per unit time exceeds a first predetermined reference value, the magnitude of reflection coefficient exceeds a second predetermined reference value and the change of the magnitude of impedance per unit time exceeds a third predetermined reference value.

Preferably, the anomaly determiner includes: a first counter for counting the number of times when the change of the magnitude of reflection coefficient per unit time exceeds a first predetermined reference value; a second counter for counting the number of times when the magnitude of reflection coefficient exceeds a second predetermined reference value; and a third counter for counting the number of times when the change of the magnitude of impedance per unit time exceeds a third predetermined reference value. The anomaly determiner determines the occurrence of anomaly when the number of times counted by the first counter exceeds a first predetermined norm number, the number of times counted by the second counter exceeds a second predetermined norm number and the number of times counted by the third counter exceeds a third predetermined norm number.

According to the above configuration, while the high-frequency power source supplies the load with high-frequency power via the impedance matching unit, detection is made for forward-wave information and reflected-wave information, and based on these forward-wave information and reflected-wave information, calculation is made for the magnitude of reflection coefficient $\Gamma$ and the differential value $d\Gamma/dt$ of the reflection coefficient $\Gamma$. Meanwhile, an input voltage and an input current to the load are detected, and based on these input voltage and the input current, the differential value $dZ/dt$ of the impedance $Z$ is calculated. Then, determination is made on an occurrence of an anomaly in the circuit on the load side, based on the magnitude of reflection coefficient $\Gamma$, the differential value $d\Gamma/dt$ of the reflection coefficient $\Gamma$ and the differential value $dZ/dt$ of the impedance $Z$.

For example, an occurrence of an anomaly in the load side circuit is affirmed when the reflection coefficient differential value $d\Gamma/dt$ has exceeded a first predetermined reference value, the magnitude of the reflection coefficient $\Gamma$ has exceeded a second predetermined reference value and the differential value $dZ/dt$ of the impedance $Z$ has exceeded a third predetermined reference value. As another example, an occurrence of an anomaly in the load side circuit is affirmed when the reflection coefficient differential value $d\Gamma/dt$ of the reflection coefficient $\Gamma$ has exceeded the first predetermined reference value more times than a first predetermined norm number, the magnitude of the reflection coefficient $\Gamma$ has exceeded the second predetermined reference value more times than a second predetermined norm number and the differential value $dZ/dt$ of the impedance $Z$ has exceeded a third predetermined reference value more times than a third predetermined norm number.

As described, anomaly occurrence determination on the load-side circuit is based not only on the differential value $d\Gamma/dt$ of the reflection coefficient $\Gamma$ and the differential value $dZ/dt$ of the impedance $Z$ but also on the magnitude of reflection coefficient $\Gamma$, which improves accuracy in the above-described anomaly detection.

Preferably, the detection point provided for the first and the second detector is inside the high-frequency power source, in a transmission line from a high-frequency power outputting end of the high-frequency power source to a high-frequency power inputting end of the impedance matching unit, or inside the impedance matching unit. The detection point provided for the third and the fourth detector is in a transmission line from inside the impedance matching unit to the load.

A third aspect of the present invention provides a high-frequency power supply system for supplying high-frequency power from a high-frequency power source to a load via an impedance matching unit. The system includes: first detector for detecting information about a forward wave traveling from the high-frequency power source toward the load; second detector for detecting information about a reflected wave traveling from the load toward the high-frequency power source; a logarithmic reflection coefficient calculator for calculating a logarithm value of a reflection coefficient at a detection point provided for the first and the second detector based on the information about the forward wave detected by the first detector and the information about the reflected wave detected by the second detector; a logarithmic reflection coefficient storage for storing the reflection coefficient logarithm value calculated by the logarithmic reflection coefficient calculator in succession at a predetermined time interval; and anomaly determiner for determining an occurrence of an anomaly on a side toward the load as from the detection point provided for the first and the second detector based on the latest value and the previous value stored in the logarithmic reflection coefficient storage.

Preferably, the anomaly determiner determines the occurrence of anomaly when the latest value stored in the logarithmic reflection coefficient storage is not smaller than a fourth predetermined reference value and the previous value stored in the logarithmic reflection coefficient storage is not greater than a fifth predetermined reference value.

Preferably, the anomaly determiner includes a fourth counter for counting the number of times when the latest value stored in the logarithmic reflection coefficient storage is not smaller than a fourth predetermined reference value and the previous value stored in the logarithmic reflection coefficient storage is not greater than a fifth predetermined reference value, and determines the occurrence of anomaly when the number of times counted by the fourth counter exceeds a fourth predetermined norm number.

Preferably, the detection point provided for the first and the second detector is inside the high-frequency power source, in a transmission line from a high-frequency power outputting end of the high-frequency power source to a high-frequency power inputting end of the impedance matching unit, or inside the impedance matching unit.

According to the above configuration, the following will take place: Specifically, while the high-frequency power source supplies the load with high-frequency power via the impedance matching unit, detection is made for a power value, a voltage value and so on, i.e. forward-wave information and reflected-wave information at any desired detection point inside the high-frequency power source, in the transmission line from the high-frequency power outputting end of the high-frequency power source to the high-frequency power inputting end of the impedance matching unit or inside the impedance matching unit. Then, based on the forward-wave information and the reflected-wave information, a logarithm value ($\log \Gamma$) of the reflection coefficient $\Gamma$ is calculated. The logarithm value $\log \Gamma$ of the reflection coefficient $\Gamma$ is stored in succession in the storage at a predetermined time interval $\Delta t$.

Then, anomaly occurrence determination is made on the basis of how the logarithm value changes within a unit time, i.e. based on the latest and the logarithmic previous values of the $\log \Gamma$ of the reflection coefficient $\Gamma$ in the storage.

It should be noted that the differential value $d\Gamma/dt$ of the reflection coefficient $\Gamma$ is not utilized here unlike in the other configurations. This is because the logarithm value $\log \Gamma$ of the reflection coefficient $\Gamma$ changes by different amounts depending on whether the reflection coefficient $\Gamma$ is in a small-value range or in a large-value range and therefore, it is not possible to determine if a given amount of change is abnormal or not by a simple comparison to a reference value. Thus, in order to enable instantaneous detection of anomalies without using the differential value $d\Gamma/dt$ of the reflection coefficient r, a similar method to the one for obtaining a reflection coefficient differential value is used, i.e. the latest value and the previous value of the reflection coefficient in the storage are used to see how the value changes within the unit time, as a base for the determination on an occurrence of an anomaly in the circuit on the load side as from the detection point of the forward-wave information and reflected-wave information.

For example, an occurrence of an anomaly on the side of the circuit toward the load as from the detection point of the forward-wave information and reflected-wave information is affirmed when the latest value in the storage is not smaller than a fourth reference value and the previous value stored in the logarithmic reflection coefficient storage is not greater than a fifth predetermined reference value. As another example, an occurrence of an anomaly on the side of the circuit toward the load as from the detection point of the forward-wave information and reflected-wave information is made when the above-described events, i.e. that the latest value is not smaller than the fourth reference value and the previous value stored in the logarithmic reflection coefficient storage is not greater than the fifth predetermined reference value, has happened in excess of a fourth predetermined norm number.

As described, the above configuration makes use of logarithm, and therefore can accept high-frequency inputs over a wide range. Another advantage is that the calculation of the logarithm value log Γ of the reflection coefficient Γ can be made by subtraction, i.e. subtracting a logarithm value of the forward-wave information from the logarithm value of the reflected-wave information. There is no need for providing a division circuit, which enables to simplify the circuit construction.

A fourth aspect of the present invention provides a high-frequency power supply system for supplying high-frequency power from a high-frequency power source to a load via an impedance matching unit. The system includes: first detector for detecting information about a forward wave traveling from the high-frequency power source toward the load; second detector for detecting information about a reflected wave traveling from the load toward the high-frequency power source; a logarithmic reflection coefficient calculator for calculating the logarithm of the magnitude of reflection coefficient at a detection point provided for the first and the second detector based on the information about the forward wave detected by the first detector and the information about the reflected wave detected by the second detector; a logarithmic reflection coefficient storage for storing the reflection coefficient logarithm value calculated by the logarithmic reflection coefficient calculator in succession at a predetermined time interval; third detector for detecting an input voltage to the load; fourth detector for detecting an input current to the load; second differentiator for calculating the change of the magnitude of impedance per unit time as viewed from a detection point provided for the third and the fourth detector toward the load based on the input voltage detected by the third detector and the input current detected by the fourth detector; and anomaly determiner for determining an occurrence of an anomaly on a side toward the load as from the detection point provided for the third and the fourth detector based on the latest value and the previous value stored in the logarithmic reflection coefficient storage, and the change of the magnitude of impedance per unit time calculated by the second differentiator.

Preferably, the anomaly determiner determines the occurrence of anomaly when the latest value stored in the logarithmic reflection coefficient storage is not smaller than a fourth predetermined reference value, the previous value stored in the logarithmic reflection coefficient storage is not greater than a fifth predetermined reference value and the change of the magnitude of impedance per unit time exceeds a third predetermined reference value.

Preferably, the anomaly determiner includes: a fourth counter for counting the number of times when the latest value stored in the logarithmic reflection coefficient storage is not smaller than a fourth predetermined reference value and the previous value stored in the logarithmic reflection coefficient storage is not greater than a fifth predetermined reference value; and a third counter for counting the number of times when the change of the magnitude of impedance per unit time exceeds a third predetermined reference value. The anomaly determiner determines the occurrence of anomaly when the number of times counted by the fourth counter exceeds a fourth predetermined norm number and the number of times counted by the third counter exceeds a third predetermined norm number.

Preferably, the detection point provided for the first and the second detector is inside the high-frequency power source, in a transmission line from a high-frequency power outputting end of the high-frequency power source to a high-frequency power inputting end of the impedance matching unit, or inside the impedance matching unit. The detection point provided for the third and the fourth detector is in a transmission line from inside the impedance matching unit to the load.

According to the above configuration, the advantages of using logarithm is offered and further, use of the differential value dZ/dt of the impedance Z enables reliable identification and detection of anomalies occurring specifically in the load.

A fifth aspect of the present invention provides a high-frequency power supply system for supplying high-frequency power from a high-frequency power source to a load via an impedance matching unit. The system includes: first detector for detecting information about a forward wave traveling from the high-frequency power source toward the load; second detector for detecting information about a reflected wave traveling from the load toward the high-frequency power source; reflection coefficient calculator for calculating a magnitude of reflection coefficient at a detection point provided for the first and the second detector based on the information about the forward wave detected by the first detector and the information about the reflected wave detected by the second detector; reflection coefficient storage for storing the reflection coefficient value calculated by the reflection coefficient calculator in succession at a predetermined time interval; and anomaly determiner for determining an occurrence of an anomaly on a side toward the load as from the detection point provided for the first and the second detector based on the latest value and the previous value stored in the reflection coefficient storage.

Preferably, the anomaly determiner determines the occurrence of anomaly when the latest value stored in the reflection coefficient storage is not smaller than a sixth predetermined reference value and the previous value stored in the reflection coefficient storage is not greater than a seventh predetermined reference value.

Preferably, the anomaly determiner includes a fifth counter for counting the number of times when the latest value stored in the reflection coefficient storage is not smaller than a sixth predetermined reference value and the previous value stored in the reflection coefficient storage is not greater than a seventh predetermined reference value, and determines the occurrence of anomaly when the number of times counted by the fifth counter exceeds a fifth predetermined norm number.

Preferably, the detection point provided for the first and the second detector is inside the high-frequency power source, in a transmission line from a high-frequency power outputting end of the high-frequency power source to a high-frequency power inputting end of the impedance matching unit, or inside the impedance matching unit.

According to the above configuration, the following will take place: Specifically, while the high-frequency power source supplies the load with high-frequency power via the impedance matching unit, detection is made for a power value, a voltage value and so on, i.e. forward-wave information and reflected-wave information at a desired detection point inside the high-frequency power source, in the transmission line from the high-frequency power outputting end of the high-frequency power source to the high-frequency power inputting end of the impedance matching unit or inside the impedance matching unit. Then, based on the forward-wave information and the reflected-wave information, a reflection coefficient Γ is calculated. The reflection coefficient Γ is stored in succession in the storage at a predetermined time interval Δt.

Then, anomaly occurrence determination is made on the basis of how the reflection coefficient changes within a unit time, i.e. based on the latest and the previous values of the reflection coefficient Γ in the storage.

For example, an occurrence of an anomaly on the side of the circuit toward the load as from the detection point of the forward-wave information and reflected-wave information is affirmed when the latest value is not smaller than a sixth reference value and the previous value stored in the logarithmic reflection coefficient storage is not greater than the seventh predetermined reference value. As another example, an occurrence of an anomaly on the side of the circuit toward the load as viewed from the detection point of the forward-wave information and reflected-wave information is affirmed when the above-described event, i.e. that the latest value is not smaller than the sixth reference value and the previous value stored in the logarithmic reflection coefficient storage is not greater than the seventh predetermined reference value, has happened in excess of a fifth predetermined norm number.

As described, the determination on an occurrence of anomaly on the side of the circuit toward the load as from the detection point of the forward-wave information and reflected-wave information is based on the same idea as using the reflection coefficient differential value, i.e. finding how the reflection coefficient has changed within a unit time by using the latest and the previous storage values. Therefore, it is possible to make anomaly determination within a quickest possible time even under situations shown in FIG. 24 and FIG. 25 for example, where an anomaly is caused by an instantaneous surge of the reflection coefficient or by a series of intermittent surges of the reflection coefficient.

Further, a reference value for the latest value in the storage and a reference value for the previous value in the storage are provided. This makes possible to make the definition of anomaly simpler and clearer.

A sixth aspect of the present invention provides a high-frequency power supply system for supplying high-frequency power from a high-frequency power source to a load via an impedance matching unit. The system includes: first detector for detecting information about a forward wave traveling from the high-frequency power source toward the load; second detector for detecting information about a reflected wave traveling from the load toward the high-frequency power source; reflection coefficient calculator for calculating a magnitude of reflection coefficient at a detection point provided for the first and the second detector based on the information about the forward wave detected by the first detector and the information about the reflected wave detected by the second detector; reflection coefficient storage for storing the reflection coefficient value calculated by the reflection coefficient calculator in succession at a predetermined time interval; third detector for detecting an input voltage to the load; fourth detector for detecting an input current to the load; second differentiator for calculating the change of the magnitude of impedance per unit time as viewed from a detection point provided for the third and the fourth detector based on the input voltage detected by the third detector and the input current detected by the fourth detector; and anomaly determiner for determining an occurrence of an anomaly on a side toward the load as from the detection point provided for the first and the second detector based on the latest value and the previous value stored in the reflection coefficient storage, and the change of the magnitude of impedance per unit time calculated by the second differentiator.

Preferably, the anomaly determiner determines the occurrence of anomaly when the latest value stored in the reflection coefficient storage is not smaller than a sixth predetermined reference value, the previous value stored in the reflection coefficient storage is not greater than a seventh predetermined reference value and the change of the magnitude of impedance per unit time exceeds a third predetermined reference value.

Preferably, the anomaly determiner includes: a fifth counter for counting the number of times when the latest value stored in the reflection coefficient storage is not smaller than a sixth predetermined reference value and the previous value stored in the reflection coefficient storage is not greater than a seventh predetermined reference value; and a third counter for counting the number of times when the change of the magnitude of impedance per unit time exceeds a third predetermined reference value. The anomaly determiner determines the occurrence of anomaly when the number of times counted by the fifth counter exceeds a fifth predetermined norm number and the number of times counted by the third counter exceeds a third predetermined norm number.

Preferably, the detection point provided for the first and the second detector is inside the high-frequency power source, in a transmission line from a high-frequency power outputting end of the high-frequency power source to a high-frequency power inputting end of the impedance matching unit, or inside the impedance matching unit. The detection point provided for the third and the fourth detector is in a transmission line from inside the impedance matching unit to the load.

According to the above configuration, the advantages of using the latest and the previous values of the reflection coefficient in the storage are offered and further, use of the differential value dZ/dt of the impedance Z enables reliable identification and detection of anomalies occurring specifically in the load.

Preferably, the high-frequency power supply system further includes an output power changer for changing an electric power outputted from the high-frequency power source in a decreasing direction upon detection of an occurrence of anomaly by the anomaly detector.

Preferably, the output power changer zeroes the electric power outputted from the high-frequency power source upon detection of the occurrence of anomaly by the anomaly detector.

Preferably, the high-frequency power supply system further include an output power resumption unit for bringing the electric power outputted from the high-frequency power source back to an original amount after a lapse of a first predetermined time from upon the change made by the output power changer on the output power.

Preferably, the high-frequency power supply system further includes a matching operation stopping unit for stopping a matching operation performed by the impedance matching unit and holding operation parameters upon the change made by the output power changer on the output power from the high-frequency power source.

Preferably, the high-frequency power supply system further includes a first determination prevention unit for preventing the anomaly determiner from performing a determining operation upon determination of the occurrence of anomaly by the determiner, throughout a period of time while the output power changer changes the power output from the high-frequency power source and the output power resumption unit brings the power output back to the original amount, and further until a second predetermined time period has passed.

Preferably, the high-frequency power supply system further includes second determination prevention unit for preventing the anomaly determiner from performing a determining operation upon commencement by a user of a power supply operation of the high-frequency power source or upon a change made by a user on an output power value setting during power supply operation, until a second predetermined time period has passed.

Preferably, the second predetermined time period is longer than a time for the impedance matching unit to perform impedance matching between the high-frequency power source and the load.

Preferably, the information detected by the first detector is a power value of the forward wave and the information detected by the second detector is a power value of the reflected wave. The information detected by the first detector is a voltage value of the forward wave and the information detected by the second detector is a voltage value of the reflected wave.

Other characteristics and advantages of the present invention will become clearer from the following description of embodiments of the present invention to be made with reference to the attached drawings.

BEST MODE FOR CARRYING OUT THE INVENTION

Preferred embodiments of the present invention will now be described below with reference to the drawings.

Figure 1:
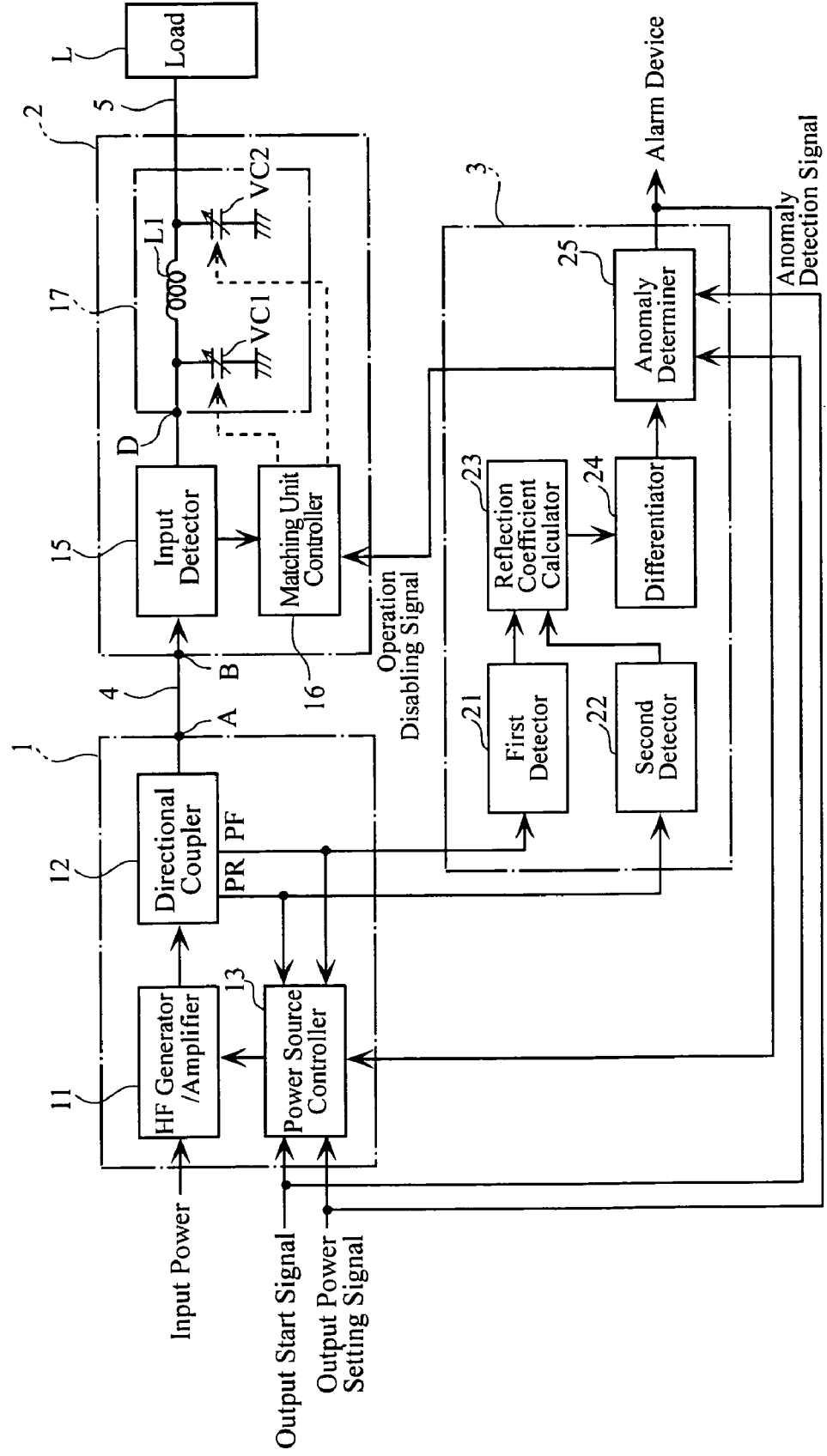
FIG. 1 shows a configuration of a high-frequency power supply system according to Embodiment 1 of the present invention.

FIG. 1 shows a configuration of a high-frequency power supply system according to Embodiment 1 of the present invention. The system supplies high-frequency power necessary for processing such works as semiconductor wafers and liquid crystal substrates, for performing e.g. plasma etching. The high-frequency power supply system includes a high-frequency power source 1, an impedance matching unit 2, an anomaly detector 3, a transmission line 4, a load connecting section 5 and a load L which is provided by a plasma processing apparatus.

The high-frequency power source 1 is connected with the impedance matching unit 2 via the transmission line 4 provided by e.g. a coaxial cable. The impedance matching unit 2 is connected with the load L (a plasma processing apparatus for example) via the load connecting section 5 provided by e.g. a copper plate which is shielded against electromagnetic leakage. In addition, the high-frequency power source 1 is connected with the anomaly detector 3. Note that although the anomaly detector 3 is provided separately from the high-frequency power source 1, this is not the only way: For example, the anomaly detector 3 may be inside the high-frequency power source 1. Alternatively, the anomaly detector 3 may be inside the impedance matching unit 2. Still alternatively, the high-frequency power source 1 may include the impedance matching unit 2.

The high-frequency power source 1 is an apparatus for supplying the load L with high-frequency power of a frequency not lower than e.g. a few hundreds of kilo Hertz. The high-frequency power source 1 includes a high-frequency wave generator/amplifier 11, a directional coupler 12 and a power source controller 13.

The high-frequency wave generator/amplifier 11 generates high-frequency power to be supplied to the load L. The high-frequency wave generator/amplifier 11 includes such unillustrated circuits as a rectifier circuit, a smoothing circuit, a power amplification circuit and an oscillation circuit. The high-frequency wave generator/amplifier 11 rectifies and smoothes an input voltage (e.g. 200 VAC) from e.g. an input power source thereby creating a DC voltage, then switches and thereby converts the DC voltage into a predetermined high-frequency voltage for output. The outputted high-frequency voltage is supplied to the load L via the directional coupler 12 and the impedance matching unit 2.

The directional coupler 12 separates a high-frequency wave traveling from the high-frequency wave generator/amplifier 11 to the load L (hereinafter called forward wave) and a high-frequency wave reflecting from the load L (hereinafter called reflected wave), and detects each of the waves. The directional coupler 12 has an input port and three output ports from first through third. The input port is connected with the high-frequency wave generator/amplifier 11. The first output port is connected with the transmission line 4. The second output port and the third output port are connected respectively with a first detector 21 and a second detector 22 of the anomaly detector 3 which is to be described later.

The forward wave inputted from the input port is outputted from the first output port. The reflected wave inputted from the first output port is outputted from the input port. The directional coupler 12 detects the forward wave after attenuating down to an appropriate level, and then outputs the wave from the second output port. Further, the directional coupler 12 detects the reflected wave after attenuating down to an appropriate level, and then outputs the wave from the third output port. Therefore, the anomaly detector 3 has its first detector 21 supplied with the forward wave PF which is outputted from the second output port of the directional coupler 12. The anomaly detector 3 has its second detector 22 supplied with the reflected wave PR which is outputted from the third output port of the directional coupler 12.

Although not shown in FIG. 1, the high-frequency power system according to the present embodiment includes an operation section which is provided with: an output start switch for commencement of the high-frequency power supply from the high-frequency power source 1; and an output power setting switch for setting an output value of the high-frequency power outputted from the high-frequency power source 1. When an operator operates the output start switch, an operation signal i.e. an output start signal is inputted, as shown in FIG. 1, into the power source controller 13 of the high-frequency power source 1 and to an anomaly determiner 25 of the anomaly detector 3. When the operator operates the output power setting switch, an operation signal i.e. an output power setting signal is inputted to the power source controller 13 of the high-frequency power source 1 and to the anomaly determiner 25 of the anomaly detector 3.

While the output start signal is present, the power source controller 13 outputs a command signal to the high-frequency wave generator/amplifier 11 whereby a forward wave power value which is obtained from the forward wave PF outputted from the directional coupler 12 is equated to an output power value which is set by the output power setting signal. It should be noted that the control operation achieved by the command signal outputted from the power source controller 13 to the high-frequency wave generator/amplifier 11 may use, in addition to the forward wave power value, a reflected wave power value which is obtained from the reflected wave PR outputted from the directional coupler 12: In this case, a difference obtained by subtracting the reflected wave power value from the forward wave power value, i.e. the power value at the load L (forward wave power value minus reflected wave power value) is equated to the output power value specified by the output setting signal.

Further, the power source controller 13 controls the high-frequency wave generating operation of the high-frequency wave generator/amplifier 11 based on an anomaly detection signal inputted from the anomaly detector 3. As will be described later, the anomaly detector 3 outputs an anomaly detection signal upon detecting an anomaly in the circuit which is on the side of the load L when viewed from an outputting end A of the high-frequency power source 1. Examples of the anomaly include insulation breakdown in the transmission line 4, poor insulation in the impedance matching unit 2 and poor contact at a connector between the transmission line 4 and the impedance matching unit 2. When the anomaly detection signal is inputted from the anomaly detector 3, the power source controller 13 stops the high-frequency power generation at the high-frequency wave generator/amplifier 11 for a predetermined period of time T.

The impedance matching unit 2 matches the impedance of the high-frequency power source 1 with the impedance of the load L. More specifically, assume that the impedance viewed from the outputting end A of the high-frequency power source 1 toward the power source (output impedance) is designed to be 50Ω, and the high-frequency power source 1 is connected with the input terminal B of the impedance matching unit 2 via the transmission line 4 which has a characteristic impedance of 50Ω. Then, the impedance matching unit 2 automatically adjusts the impedance viewed from the input terminal B of the impedance matching unit 2 toward the load L as close to 50Ω as possible. Note that the value 50Ω for the characteristic impedance is only an example for the present embodiment, and the characteristic impedance is obviously not limited to be 50Ω.

The impedance matching unit 2 generally includes an input detector 15, a matching unit controller 16 and a matching section 17.

The input detector 15 detects a high-frequency voltage V and a high-frequency current I of the high-frequency wave (forward wave) inputted from the high-frequency power source 1 as well as a phase difference θ between the two. The high-frequency voltage V, the high-frequency current I and the phase difference θ detected by the input detector 15 are then inputted to the matching unit controller 16.

The matching unit controller 16 uses the high-frequency voltage V, the high-frequency current I and the phase difference θ which are inputted from the input detector 15, to calculate an input impedance Zin (impedance viewed from the input terminal B toward the load L), and controls variable impedance devices, i.e. variable capacitors VC1, VC2 (to be described later), in the matching section 17 so that the input impedance Zin will be 50Ω. More specifically, the matching unit controller 16 keeps the value |V|/|I| within a predetermined range, e.g. 50±5Ω while maintaining the phase difference θ essentially being 0° through the control over the variable capacitors VC1, VC2.

The matching section 17 is provided by a π connection circuit of an inductor L1 and the variable impedance devices provided by the variable capacitors VC1, VC2. Each of the variable capacitors VC1, VC2 has a pair of opposed electrodes, one of which is movable by an unillustrated driver i.e. an electric motor. By moving the movable electrode thereby changing the area of overlap between the opposed electrodes, capacitance of each capacitor can be varied. Movement of the movable electrodes in the variable capacitors VC1, VC2 is controlled on the basis of control signals from the matching unit controller 16.

With the above, the matching section 17 varies the capacitance in each of the variable capacitors VC1, VC2 based on the control signal from the matching unit controller 16, thereby providing adjustment so the magnitude (absolute value) of the input impedance Zin stays within a predetermined range (50±5Ω for example) and the phase difference θ is essentially 0°. In the present embodiment in FIG. 1, the matching section 17 uses a type π circuit configuration; however, the circuit configuration may be otherwise, such as type T, L, or inverted L. Further, the variable impedance devices may be provided by variable inductors instead of by variable capacitors.

The matching unit controller 16 receives an operation disabling signal from the anomaly detector 3. The operation disabling signal is a signal which prevents the matching unit controller 16 from performing the above-described matching operation. The signal may be a square wave signal which assumes HIGH level when disabling the matching operation. Upon detecting an anomaly, the anomaly detector 3 outputs the anomaly detection signal to the high-frequency power source 1 while outputting to the matching unit controller 16 the operation disabling signal which assumes HIGH level for the predetermined period of time T (See FIG. 2). With this arrangement, upon detection of an anomaly by the anomaly detector 3, the matching unit controller 16 stops the matching operation by the impedance matching unit 2 for the period of time in which the high-frequency power source 1 is paused.

As described, the matching operation by the impedance matching unit 2 is stopped while the power outputting operation by the high-frequency power source 1 is paused. This is necessary in order to avoid a problem that without power output from the high-frequency power source 1 the input detector 15 cannot detect the impedance Zin for automatic impedance matching. Another reason why the matching operation by the impedance matching unit 2 is stopped is to avoid a problem that allowing the impedance matching unit 2 to do matching operation without power output will result in indefinite capacitance value settings in the variable capacitors VC1, VC2 in the matching section 17. In this situation the variable capacitors VC1, VC2 are likely to have capacitance values which represent a large un-match, and if this is the situation at the time when the high-frequency power source 1 resumes power output operation, it will become impossible to establish a matched state quickly.

If the matching operation by the impedance matching unit 2 is stopped while there is no power output, capacitance values of the variable capacitors VC1, VC2 will stay at adjusted values which were established right before the power output was stopped, and the values will not have a chance to be altered for a larger un-match. Thus, it becomes possible to establish a matched state quickly once the high-frequency power source 1 resumes its power output operation.

The load L is a plasma processing apparatus for processing works such as semiconductor wafers and liquid crystal substrates by means of etching, CVD, etc. The plasma processing apparatus provides a variety of processing environments depending on the purpose of process performed to the work. For example, when etching a work, the etching process is performed using a specific gas suitable for the etching, at a specific gas pressure, at a specific electric power value of the high-frequency power, and a supply time of the high-frequency power. In the plasma processing, a work is placed in a container (not illustrated), into which a plasma discharge gas is introduced. As the high-frequency power is supplied, the plasma discharge gas discharges to turn the gas from non-plasma state into plasma state. The work is processed using the plasma gas.

The anomaly detector 3 detects anomalies in the load L as well as anomalies in the coaxial cable, i.e. the transmission line 4 and a coaxial connector provided at each end of the coaxial cable. Examples of the anomalies are poor insulation, insulation breakdown and poor contact. The anomaly detector 3 includes the first detector 21, the second detector 22, a reflection coefficient calculator 23, a differentiator 24 which calculates a change in the magnitude of reflection coefficient Γ per unit time, and an anomaly determiner 25 which determines if a given situation is abnormal or not based on the output from the differentiator 24.

The first detector 21 rectifies an amplitude Vf of the forward wave PF. The second detector 22 rectifies an amplitude Vr of the reflected wave PR. The first detector 21 and the second detector 22 are each provided by a conventional, unillustrated diode detector-circuit which includes a diode and an RC low pass filter. The detected values Vf, Vr from the first detector 21 and the second detector 22 are inputted to the reflection coefficient calculator 23. Note that the first and the second detectors 21, 22 may have a different configuration, i.e. may be provided by other types of the rectifier circuit for example.

The reflection coefficient calculator 23 calculates a reflection coefficient Γ=Vr/Vf from the amplitude Vf of the forward wave PF inputted from the first detector 21 and the amplitude Vr of the reflected wave PR inputted from the second detector 22. The reflection coefficient calculator 23 calculates a value of the reflection coefficient Γ by first converting the amplitude Vf of the forward wave PF and the amplitude Vr of the reflected wave PR into digital amplitude values Df, Dr using an A/D converter (not illustrated) and then calculating Dr/Df. The reflection coefficient Γ is calculated at a predetermined time interval Δt. The obtained data on the reflection coefficient Γ is inputted to the differentiator 24.

Alternatively, the reflection coefficient calculator 23 may generate an analog Vr/Vf signal. In this case, the generated analog signal is converted into digital data by an A/D converter. The first detector 21 and the second detector 22 may be provided by power detection circuits. In this case, respective power detection circuits detect a power Wf of the forward wave PF and a power Wr of the reflected wave PR, and the reflection coefficient calculator 23 calculates $(Wr/Wf)^{1/2}$ to obtain the reflection coefficient Γ.

The differentiator 24 obtains a change per unit time, of the magnitude of the reflection coefficient Γ given by the reflection coefficient calculator 23. In other words, the differentiator 24 obtains the differentiation (dΓ/dt) of the reflection coefficient Γ. Hereinafter, the change of the reflection coefficient Γ per unit time will be called the reflection coefficient differentiation dΓ/dt.

For each input of the reflection coefficient Γ made by the reflection coefficient calculator 23 at a predetermined interval dt, the differentiator 24 calculates a difference dΓ=Γ2−Γ1 between the previous reflection coefficient Γ1 and the new reflection coefficient Γ2, as well as dΓ/dt. It should be noted that if the reflection coefficient calculator 23 provides an analog form of signal for the reflection coefficient Γ, the differentiator 24 converts the reflection coefficient Γ from the analog form into digital form by using an A/D converter before calculating dΓ/dt. The calculation result (dΓ/dt) given by the differentiator 24 is inputted to the anomaly determiner 25.

The anomaly determiner 25 determines on whether or not there is any anomaly occurring, based on the reflection coefficient differentiation value dΓ/dt inputted from the differentiator 24. Upon determination that there is, the anomaly determiner 25 outputs the anomaly detection signal to the power source controller 13 of the high-frequency power source 1, indicating presence of an anomaly for a first predetermined time T (See FIG. 2) while outputting the operation disabling signal to the matching unit controller 16.

Figure 3:
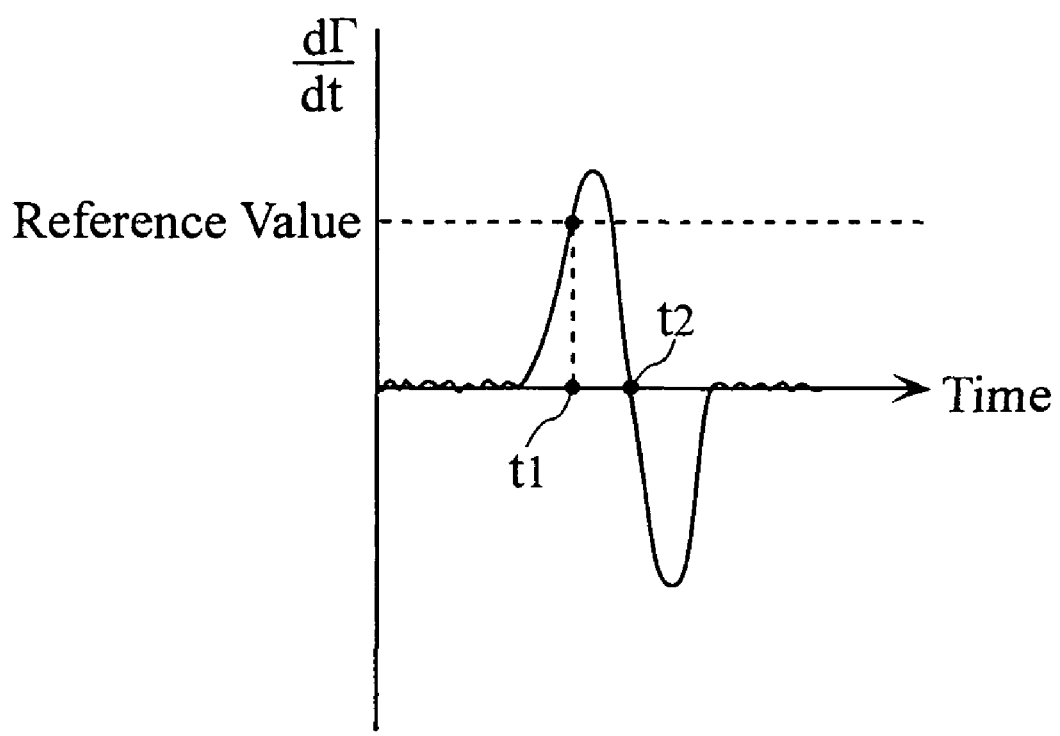
FIG. 3 shows a relationship between reflection coefficient differential values and a reference value.

Specifically, the anomaly determiner 25 compares the reflection coefficient differential value dΓ/dt with a predetermined reference value which is preset. If the differential value dΓ/dt exceeds the reference value, the determiner determines that an anomaly exists in the circuit from the outputting end A of the high-frequency power source 1 toward the load L, and outputs an anomaly detection signal e.g. a high-level signal for the first predetermined time T. For example, assume that the reflection coefficient differential value dΓ/dt has changed as shown in FIG. 3. Then, the anomaly determiner 25 outputs the anomaly detection signal which assumes HIGH level for the predetermined time T, at a time point t1 when the reflection coefficient differential value dΓ/dt has exceeded the reference value. Note that FIG. 3 also shows a time point t2, at which the reflection coefficient Γ takes an extremal. Since the anomaly determiner 25 detects anomalies based on the reflection coefficient differential value dΓ/dt, the anomaly detection is instantaneous, being quicker than anomaly detection based on the reflection coefficient Γ.

Following the anomaly detection signal which indicates presence of an anomaly, the power source controller 13 stops generation of the high-frequency power by the high-frequency wave generator/amplifier 11 for the predetermined time T. Also, the matching unit controller 16 disables the matching operation by issuing an operation disabling signal.

Figure 2:
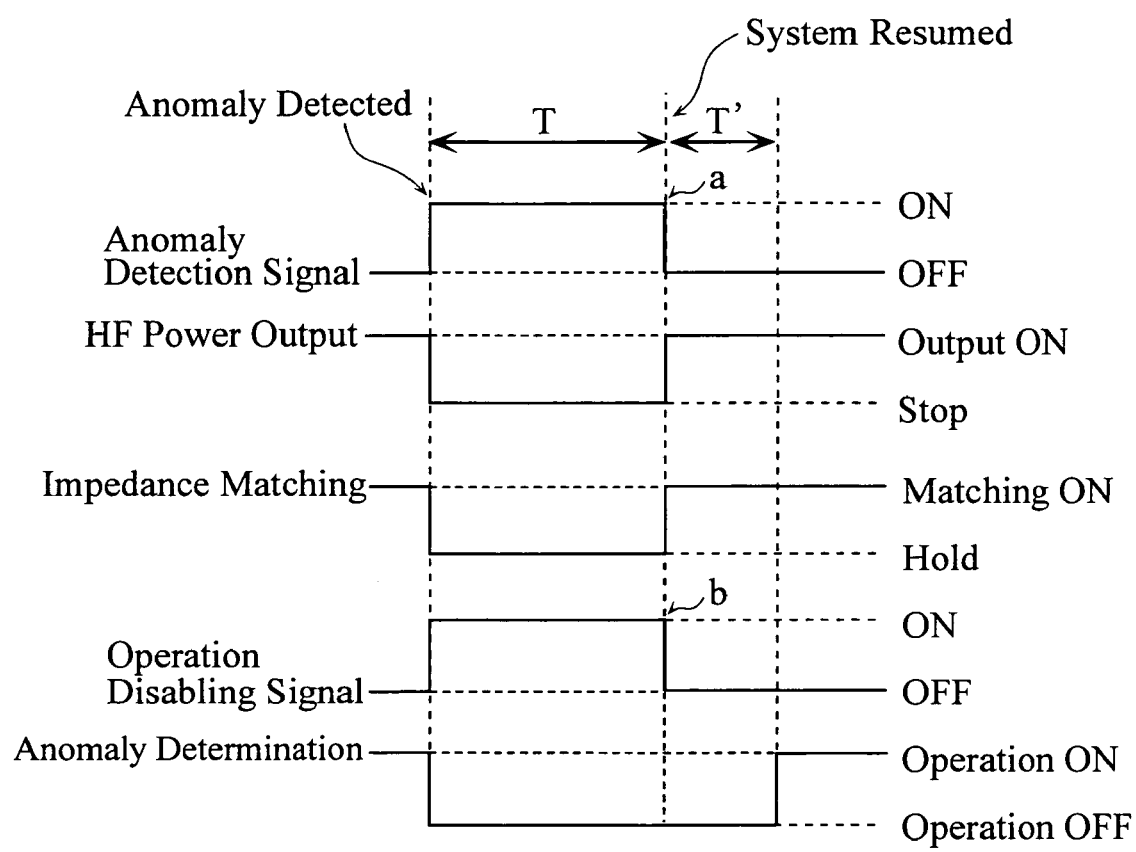
FIG. 2 is a diagram for describing time points for generation of anomaly detection signal, etc.

After a lapse of the first predetermined time T since the determination that there was an anomaly, the anomaly determiner 25 reverses the output level of the anomaly detection signal (See an indication point "a" in FIG. 2). Thus, the power source controller 13 cancels the pause on high-frequency power output from the high-frequency power source 1 and resumes high-frequency power output. Also, the anomaly determiner 25 reverses the output level of the operation disabling signal to the matching unit controller 16 (See an indication point "b" in FIG. 2). Thus, the matching unit controller 16 resumes the matching operation.

Further, the anomaly determiner 25 disables the anomaly determining operation for the first predetermined time T and further, until a second predetermined time period T' has passed. Specifically, the anomaly determining operation is disabled from the time when presence of an anomaly is detected, for a period of time T+T'. The second predetermined time T' is a time obtained empirically or experimentally, which is believed to be longer than an estimated amount of time necessary for the impedance matching unit 2 to establish a state of substantial impedance matching after the commencement of high-frequency wave output from the high-frequency power source 1. It should be noted that anomaly determining operation is also disabled until the second predetermined time period T' has passed in other occasions; namely, when the high-frequency power output operation is first started, and when the high-frequency power output value setting has been changed to a new value.

The time when the high-frequency power output operation is first started can be detected by monitoring the output start signal. Likewise, whether or not the high-frequency power output value setting has been changed can be detected by monitoring the output power setting signal.

A state of unmatched impedance can occur for a period of time right after the high-frequency power source 1 has started its high-frequency power output or right after the high-frequency power output value setting has been changed during power supply operation, even if there is no anomaly in the circuit from the outputting end A of the high-frequency power source 1 toward the load L. Under this state, the reflection coefficient Γ increases, and the state can be misjudged as abnormal. For this reason, anomaly determining operation is disabled for the second predetermined time period T'.

On the other hand, if an anomaly occurs while the impedance matching unit 2 maintains the matched state, the anomaly is detected instantaneously by the anomaly detector 3 using the reflection coefficient differential value dΓ/dt as described above, and the system stops the high-frequency output operation performed by the high-frequency power source 1 and the matching operation performed by the impedance matching unit 2. The anomaly detector 3 performs anomaly determining operation only after the high-frequency power source 1 has started high-frequency output operation (or resumed the operation after a pause) and the impedance matching unit 2 has essentially established a matched state.

The anomaly determiner 25 is connected with an unillustrated alarm device for example, and the anomaly detection signal is inputted to the alarm device and the power source controller 13 of the high-frequency power source 1. Simultaneously with the anomaly detection signal, the impedance matching unit 2 is supplied with the operation disabling signal which has been inverted to HIGH level. Upon input of the anomaly detection signal, the alarm device announces the presence of anomaly by means of display or sound. Meanwhile, as has been described, the high-frequency power source 1 stops its high-frequency power output operation for the predetermined time T upon input of the anomaly detection signal whereas the impedance matching unit 2 stops its matching operation for the predetermined time T upon input of the operation disabling signal.

Next, description will cover an anomaly detecting process in the high-frequency power supply system according to Embodiment 1.

When the power source for the high-frequency power source 1 is turned ON for allowing the plasma processing apparatus (load L) to perform plasma processing, the high-frequency power source 1 generates a predetermined high-frequency power, which is supplied to the load L via the transmission line 4, the impedance matching unit 2 and the load connecting section 5.

When the high-frequency power is inputted from the high-frequency power source 1 to the impedance matching unit 2, the impedance matching unit 2 detects the magnitude |V|/|I| of the input impedance Zin (impedance at the input terminal B) in the impedance matching unit 2, and the phase difference θ based on the inputted power. Based on the detected information, the impedance matching unit 2 automatically adjusts the variable capacitors VC1, VC2 in the matching section 17 so as to make the input impedance Zin equal to the characteristic impedance 50Ω.

Right after the high-frequency power source 1 is started, i.e. right after the high-frequency power is inputted from the high-frequency power source 1 to the impedance matching unit 2, the input impedance Zin of the impedance matching unit 2 is usually out of the characteristic impedance (50Ω), which means that the system is in an unmatched state. Once the impedance matching unit 2 starts automatic impedance adjusting operation, the input impedance Zin is brought into a pre-set range of matching (50±5Ω for example) after a lapse of a predetermined period of time, e.g. in three seconds. Thereafter, the impedance matching unit 2 continues its automatic adjusting operation by varying capacitance values of the variable capacitors VC1, VC2 in response to fluctuation in the impedance Z1 of the load L, so that the input impedance Zin will always stay within the predetermined range of matching.

Once the high-frequency power source 1 starts supplying high-frequency power, the directional coupler 6 separately detects the forward wave PF and the reflected wave PR of the high frequency wave, and inputs detected signals to the anomaly detector 3. The anomaly detector 3 calculates a reflection coefficient differential value $d\Gamma/dt$ from the forward wave PF and the reflected wave PR, and determines on whether or not an anomaly exists in the circuit from the outputting end A of the high-frequency power source 1 toward the load L, based on the change in the reflection coefficient differential value $d\Gamma/dt$. In other words, as the high-frequency power source 1 starts power supply, the anomaly detector 3 starts watching for an occurrence of anomaly in the circuit from the outputting end A of the high-frequency power source 1 toward the load L based on the change in the reflection coefficient differential value $d\Gamma/dt$.

Note that the anomaly determining operation by the anomaly detector 3 is disabled for a period of time T+T' (See FIG. 2) upon determination that an anomaly exists. Thus, the watch for anomalies by the anomaly detector 3 begins essentially when the impedance matching unit 2 has completed its impedance matching adjustment and has started to maintain the matched state.

Therefore, according to the present high-frequency power supply system, impedance matching between the high-frequency power source 1 and the plasma processing apparatus L is performed automatically by the impedance matching unit 2 under a watch by the anomaly detector 3 for anomalies in the route from the outputting end A of the high-frequency power source 1 toward the load L and thus, the high-frequency power from the high-frequency power source 1 is supplied to the high-frequency power plasma processing apparatus L at a maximum possible efficiency until the plasma processing apparatus L finishes the plasma processing, i.e. until the power supply from the high-frequency power source 1 is turned off.

Now, with the high-frequency power source 1 supplying the load L with high-frequency power, assume that insulation breakdown, poor insulation, poor contact or other anomaly has occurred in the circuit from the outputting end A of the high-frequency power source 1 toward the load L, such as in the transmission line 4, in a connector which connects the transmission line 4 with the high-frequency power source 1 or with the impedance matching unit 2, inside the impedance matching unit 2, etc. The impedance changes at the point where the anomaly is present, resulting in increase in the reflected wave.

For an anomaly which occurs in the route from the output terminal of the impedance matching unit 2 toward the load L, the impedance matching unit 2 performs automatic impedance matching operation in response to the impedance fluctuation on the load L side. The high-frequency power supply system operates for the best of its ability in supplying the load L with the high-frequency power while suppressing the increase in the reflected wave which travels back toward the high-frequency power source. If this state continues, the component on the load L side, where the anomaly originated, will continue to receive the high-frequency power, leading to increased damage. Then, if the damage increases to an extent that the impedance matching unit 2 can no longer match the impedance differences, a very large reflected wave will come back to the high-frequency power source 1, damaging also the high-frequency power source 1.

A similar phenomenon will result if an anomaly occurs between the high-frequency power source 1 and the impedance matching unit 2. In this case however, the impedance matching operation by the impedance matching unit 2 is not performed. For example, poor insulation or insulation breakdown in the transmission line 4 will result in impedance un-match at this particular portion, and there will be a very large reflected wave coming back to the high-frequency power source 1, which will damage the high-frequency power source 1.

However, according to the high-frequency power supply system offered by the present embodiment, the anomaly detector 3 watches for anomalies by using the reflection coefficient differential value $d\Gamma/dt$ which is calculated from the forward wave PF and the reflected wave PR inputted from the high-frequency power source 1. Thus, as soon as an anomaly occurs in the circuit from the outputting end A of the high-frequency power source 1 toward the load L, the occurrence is detected since the reflected wave PR which is inputted to the anomaly detector 3 increases and the reflection coefficient differential value $d\Gamma/dt$ exceeds a predetermined reference value.

As shown in FIG. 2, when the anomaly determiner 25 judges that an anomaly exists, an anomaly detection signal (HIGH level signal) is inputted from the anomaly determiner 25 to the power source controller 13 in the high-frequency power source 1 and to the alarm device (not illustrated). Upon input of the anomaly detection signal, the power source controller 13 controls the high-frequency wave generator/amplifier 11 and stops high-frequency power generation (See the High-Frequency Power Output waveform). Upon input of the anomaly detection signal, the alarm device issues an alarm indicating that an anomaly has occurred in the high-frequency power supply system.

As described, power output operation of the high-frequency power source 1 is stopped by the anomaly detection signal right upon detection of an anomaly and therefore, damage incurred by the anomaly is prevented from spreading, and the high-frequency power source 1 is protected from damages caused by the reflected wave. In particular, anomaly detection by means of the reflection coefficient differential value $d\Gamma/dt$ enables early-stage detection of anomalies right after the anomaly occurs and before the reflection coefficient Γ reaches an abnormal value, allowing safety functions such as power output stoppage from the high-frequency power source 1 to work effectively.

Then, after a lapse of the predetermined time period T since the stoppage of high-frequency power from the high-frequency wave generator/amplifier 11, the power source controller 13 resumes the high-frequency power output at the previous output value. There is a reason for it: Sometimes, anomaly detection picks a momentary anomaly such as a momentary surge in the load caused by an arc discharge in the plasma processing apparatus L. In this and other kinds of anomalies, the system can often recover from minor damages caused by the anomalies, and a system which must always be resumed manually will simply deteriorate operation efficiency. By automatically resuming the high-frequency power supply system, dead time or loss of operation efficiency is reduced. It should be noted here that the value for the predetermined period of time T is obtained empirically or experimentally.

In the present embodiment, stoppage of the power output operation from the high-frequency power source 1 upon detection of an anomaly is only for a predetermined period of time T in view of operation efficiency. Alternatively, the power output operation from the high-frequency power source 1 may be stopped permanently for increased safety.

When the anomaly determiner 25 determines that an anomaly exists, the anomaly determiner 25 inputs the operation disabling signal (HIGH level signal) as shown in FIG. 2, to the matching unit controller 16 of the impedance matching unit 2. Upon input of the operation disabling signal, the matching unit controller 16 stops operation control of the variable impedance devices, i.e. the variable capacitors VC1, VC2, in the matching section 17 for the predetermined time period T while keeping capacitance values of the variable capacitors VC1, VC2 as they were at the time when the anomaly was found.

Thus, when the power output operation from the high-frequency power source 1 is resumed after a lapse of the predetermined time T, the impedance matching unit 2 starts its impedance matching operation with the capacitance values of the variable capacitors VC1, VC2 as of the moment when the power output operation was stopped. By starting with a state of un-match which is not so dissimilar, the system can achieve the impedance matching quickly.

In the anomaly detector 3, the low level (Operation OFF) signal keeps preventing the anomaly determining operation until the period of time T' has passed, i.e. until a state of matching has been established by the impedance matching unit 2, for the impedance matching unit is in the state of unmatched impedance right after the high-frequency power source 1 resumes its operation.

Therefore, the anomaly determiner 25 is disabled from performing the determining operation, the power supply from the high-frequency power source 1 is stopped, and the disabled state continues for a predetermined period of time T plus for a period of time T' which is the time necessary for the impedance matching unit 2 to bring the system into a state of matching. This arrangement can prevent false anomaly detections by the anomaly detector 3 of a state of unmatched impedance right after the power supply is resumed from the high-frequency power source 1.

Figure 4:
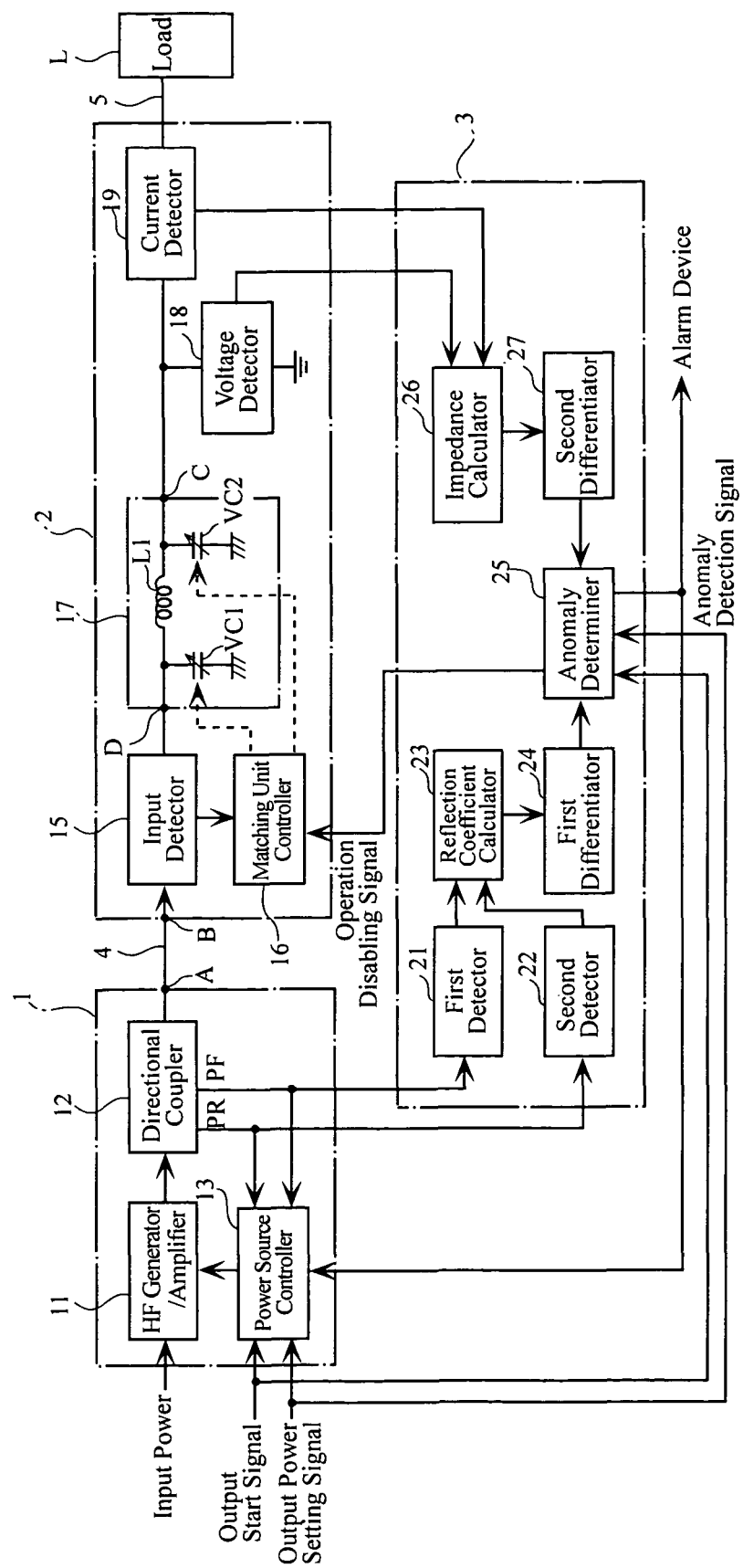
FIG. 4 shows a configuration of a high-frequency power supply system according to Embodiment 2 of the present invention.

FIG. 4 shows a configuration of a high-frequency power supply system according to Embodiment 2 of the present invention. In Embodiment 1, anomaly detection is made in the route from the outputting end A of the high-frequency power source 1 toward the load L, based on the differential value $d\Gamma/dt$ of the reflection coefficient $\Gamma$ in the high-frequency output at the outputting end A of the high-frequency power source 1. In Embodiment 2, detection is made specifically for anomalies in the load L, based on the differential value $d\Gamma/dt$ of the reflection coefficient $\Gamma$ in the high-frequency output at the outputting end A of the high-frequency power source 1 and an impedance differential value at the inputting end of the load L.

Now, differences from Embodiment 1 will be described: In the impedance matching unit 2, the matching section 17 is followed by a voltage detector 18 and a current detector 19.

The voltage detector 18 detects a voltage value $V_L$ of the high-frequency wave at an output terminal C of the matching section 17. Specifically, the output terminal C of the matching section 17 is connected with the load L via the load connecting section 5 and therefore, the voltage detector 18 detects the voltage value $V_L$ which is the voltage value of the high-frequency wave at the input end on the load L side.

The current detector 19 detects an electric current value $I_L$ of the high-frequency wave at the output terminal C of the matching section 17. Specifically, the output terminal C of the matching section 17 is connected with the load L via the load connecting section 5 and therefore, the current detector 19 detects the electric current value $I_L$ which is the current value of the high-frequency wave at the input end on the side on the load L side.

The voltage value $V_L$ detected by the voltage detector 18 and the electric current value $I_L$ detected by the current detector 19 are given to an impedance calculator 26 (to be described later) of the anomaly detector 3.

The anomaly detector 3 is provided with the impedance calculator 26 and a second differentiator 27 which calculates the change of the magnitude of impedance per unit time. It should be noted that the differentiator 24 used in Embodiment 1 is called "the first differentiator 24" when used in Embodiment 2.

The impedance calculator 26 calculates an impedance $Z=V_L/I_L$ from the voltage value $V_L$ at the inputting end of the load L supplied from the voltage detector 18 and the electric current value $I_L$ at the inputting end of the load L supplied from the current detector 19. The impedance calculator 26 calculates the value of the impedance Z by first converting the voltage value $V_L$ inputted from the voltage detector 18 and the electric current value $I_L$ inputted from the current detector 19 into digital amplitude values Dv, Di using an A/D converter and then calculating Dv/Di. The impedance Z is calculated at a predetermined time interval $\Delta t$. The obtained data on the impedance Z is inputted to the second differentiator 27. It should be noted that the impedance calculator 26 may generate an analog $V_L/I_L$ signal, and sends the signal to an A/D converter for digital conversion.

The second differentiator 27 obtains a change per unit time of the magnitude of the impedance Z calculated by the impedance calculator 26. In other words, the second differentiator 27 obtains the differential value (dZ/dt) of the magnitude of impedance Z. Hereinafter, the change of the magnitude of the impedance Z per unit time will be called impedance differential value dZ/dt.

For each input of the impedance Z made by the impedance calculator 26 at a predetermined interval dt, the second differentiator 27 calculates a difference dZ=Z2−Z1 between the previous impedance input Z1 and the latest impedance input Z2, as well as dZ/dt. It should be noted that if the impedance calculator 26 provides the impedance Z in the form of analog signal, the second differentiator 27 converts the impedance Z from the analog signal into digital data by using an A/D converter before calculating the dZ/dt. The calculation result (dZ/dt) given by the second differentiator 27 is inputted to the anomaly determiner 25.

The anomaly determiner 25 determines on whether or not there is any anomaly happening, based on the reflection coefficient differentiation value $d\Gamma/dt$ inputted from the first differentiator 24 and the impedance differential value dZ/dt inputted from the second differentiator 27. Upon determination that there is, the anomaly determiner outputs an anomaly detection signal to the power source controller 13 of the high-frequency power source 1, indicating presence of an anomaly for a first predetermined time T (See FIG. 2) while outputting an operation disabling signal to the matching unit controller 16.

Specifically, the anomaly determiner 25 compares the reflection coefficient differential value $d\Gamma/dt$ with a predetermined reference value which is preset, and compares the impedance differential value dZ/dt with a predetermined reference value which is preset. If the differential value $d\Gamma/dt$ exceeds the given reference value and the impedance differential value dZ/dt exceeds the given reference value, the anomaly determiner 25 determines that an anomaly exists on the side of load L, and outputs the anomaly detection signal e.g. a high-level signal for the first predetermined time T (See FIG. 2).

Figure 5:
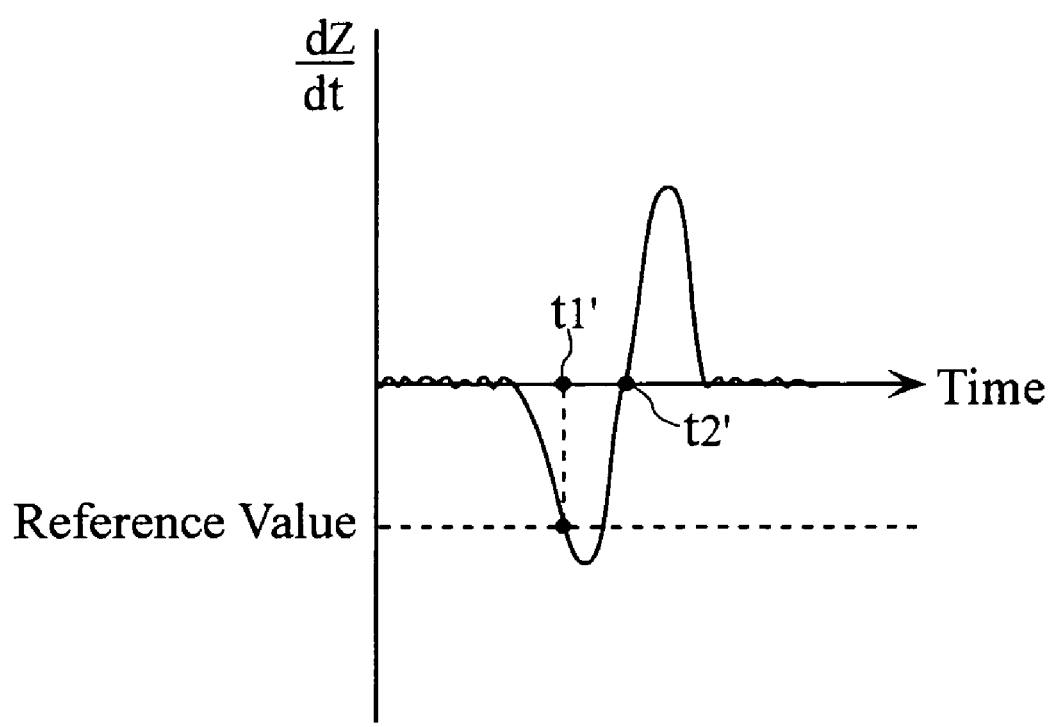
FIG. 5 shows a relationship between impedance differential values and a reference value.

For example, take a case in which the differential value $d\Gamma/dt$ of the reflection coefficient $\Gamma$ makes a change as shown in FIG. 3. Assume that the differential value $d\Gamma/dt$ of the reflection coefficient $\Gamma$ has exceeded the reference value (See Time Point t1), and the impedance differential value $dZ/dt$ has made a change as shown in FIG. 5. The anomaly determiner 25 outputs the high level signal when the differential value $dZ/dt$ of the impedance Z has exceeded the reference value (See Time Point t1'). Note that in FIG. 3, Time Point t2 is a time point when the reflection coefficient r achieves an extremal. In FIG. 5, Time Point t2' is a time point when the impedance Z achieves an extremal.

As described, the anomaly detection makes use of the differential value $d\Gamma/dt$ of the reflection coefficient $\Gamma$ and the differential value $dZ/d$ of the impedance Z. This enables reliable detection of anomalies on the side of load L. Specifically, obtaining the differential value $d\Gamma/dt$ of the reflection coefficient $\Gamma$ enables to detect anomalies in the circuit from the outputting end A of the high-frequency power source 1 toward the load L, but if anomalies occurring only in the load L are to be detected, it is difficult to do so only with the differential value $d\Gamma/dt$ of the reflection coefficient $\Gamma$ because the circuit from the outputting end A of the high-frequency power source 1 toward the load L includes the transmission line 4 and the impedance matching unit 2. On the other hand, measurement of the impedance Z at the inputting end of the load L alone will not give sufficient clues for establishing the reference value for determining the anomaly, and thus it is difficult to detect anomalies occurring specifically in the load L.

For this reason, in the present Embodiment 2, both the differential value $d\Gamma/dt$ of the reflection coefficient $\Gamma$ and the differential value $dZ/dt$ of the impedance Z are obtained whereby anomalies occurring specifically in the load L are identified and detected.

Since the anomaly determiner 25 detects anomalies based on the differential value $d\Gamma/dt$ of the reflection coefficient $\Gamma$ and the impedance differential value $dZ/dt$, detection is made instantaneously, or more quickly than in methods which rely only on the magnitude of the reflection coefficient $\Gamma$ or in methods which depend upon the magnitude of the impedance Z.

Now, description will be made in more specific details. Once the high-frequency power source 1 starts supplying high-frequency power, the high-frequency power source 1 separately detects the forward wave PF and the reflected wave PR of the high frequency wave, and inputs detected signals to the anomaly detector 3. Meanwhile, the impedance matching unit 2 inputs the voltage value and the electric current value at the inputting end of the load L to the anomaly detector 3. The anomaly detector 3 calculates the differential value $d\Gamma/dt$ of the reflection coefficient $\Gamma$ from the forward wave PF and the reflected wave PR, as well as the impedance differential value $dZ/dt$ from the voltage value and the electric current value from the impedance matching unit 2, and determines on whether or not there is any anomalies in the circuit on the side of load L, based on the change in the differential value $d\Gamma/dt$ of the reflection coefficient $\Gamma$ and the change in the impedance differential value $dZ/dt$. In other words, as the high-frequency power source 1 starts its power supplying operation, the anomaly detector 3 starts its watch for anomalies on the side of load L based on the change in the differential value $d\Gamma/dt$ of the reflection coefficient $\Gamma$ and the change in the impedance differential value $dZ/dt$.

In the above case, the watch by the anomaly detector 3 is based on the differential value $d\Gamma/dt$ of the reflection coefficient $\Gamma$ which is calculated from the forward wave PF and the reflected wave PR inputted from the high-frequency power source 1 and therefore, it is possible to infer anomalies including those occurring in the load L as well as in the circuit from the outputting end A of the high-frequency power source 1 toward the load L. For example, it is possible to infer abnormal occurrences such as insulation breakdown, poor insulation or poor contact, in the transmission line 4, in line connectors connecting the transmission line 4 with the high-frequency power source 1 or with the impedance matching unit 2, or within the impedance matching unit 2.

However, according to the configuration offered by Embodiment 2, the anomaly detector 3 further makes use of the $dZ/dt$ of the impedance Z calculated from the voltage value $V_L$ and the electric current value $I_L$ measured at the inputting end of the load L. This makes possible not only to detect anomalies in the circuit from the outputting end A of the high-frequency power source 1 toward the load L, but also to identify and reliably detect anomalies in the load L.

Further, according to Embodiment 2, it is possible to identify anomalies between the outputting end A of the high-frequency power source 1 and the measuring point of voltage and current. For example, if the differential value $d\Gamma/dt$ of the reflection coefficient $\Gamma$ has exceeded a predetermined reference value but the differential value $dZ/dt$ of the impedance Z has not exceeded a reference value predetermined for it, it is possible to determine that this anomaly, which is e.g. insulation breakdown, poor insulation or poor contact, can be in the transmission line 4, in a connector connecting the transmission line 4 with the high-frequency power source 1 or with the impedance matching unit 2, or inside the impedance matching unit 2.

Once an anomaly is indicated by the anomaly detection signal, the power source controller 13 stops high-frequency power generation performed by the high-frequency wave generator/amplifier 11 for the first predetermined time period T and the matching unit controller 16 issues an operation disabling signal to disable the matching operation, and other controlling operations takes place just the same way as in Embodiment 1, so no more description will be made for these here.

Figure 6:
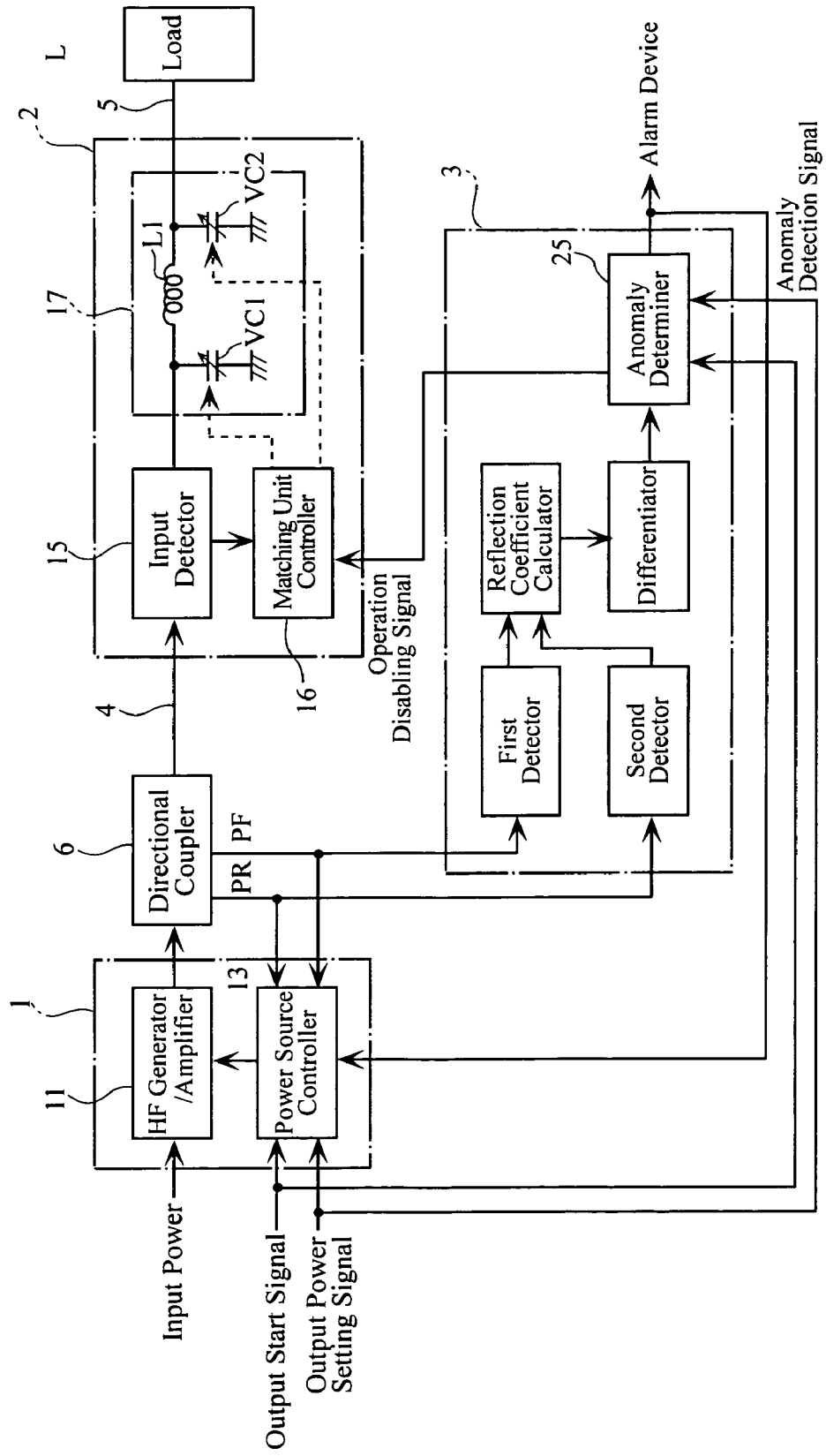
FIG. 6 shows a configuration of a high-frequency power supply system according to Embodiment 3 of the present invention.

FIG. 6 shows a configuration of a high-frequency power supply system according to Embodiment 3 of the present invention. In Embodiment 1, the detection point for the reflection coefficient $\Gamma$ is near the outputting end within the high-frequency power source 1. In Embodiment 3, the detection point for the reflection coefficient $\Gamma$ is in the transmission line 4. Specifically, the configuration in FIG. 6 does not include a directional coupler 12 in the high-frequency power source 1, but includes a directional coupler 6 in the transmission line 4. The high-frequency power source 1 and the directional coupler 6, as well as the directional coupler 6 and the impedance matching unit 2 are connected with each other by a transmission line 4 provided by a coaxial cable. The directional coupler 6 has a second output port and a third output port connected with the first detector 21 and the second detector 22 of the anomaly detector 3 respectively.

Anomaly determining operation in the high-frequency power supply system according to Embodiment 3 is the same as the anomaly determining operation in the high-frequency power supply system according to Embodiment 1, and therefore details will not be repeated here. In the high-frequency power supply system according to Embodiment 3, the anomaly detection point is in the transmission line 4 (specifically, at the directional coupler 6) and so, the system detects anomalies in the circuit from the directional coupler 6 toward the load L; i.e. the system detects insulation breakdown or poor contact in the transmission line 4 which connects the directional coupler 6 with the impedance matching unit 2 as well as in their connectors, poor insulation in the impedance matching unit 2, or anomalies in the load L, with the same functions and advantages as achieved in Embodiment 1.

It should be noted that the configuration in Embodiment 3 where the detection point for the reflection coefficient $\Gamma$ is in the transmission line 4 may be applied to the configuration in Embodiment 2 in FIG. 4 where an impedance differential value is detected at an inputting end of the load L.

Figure 7:
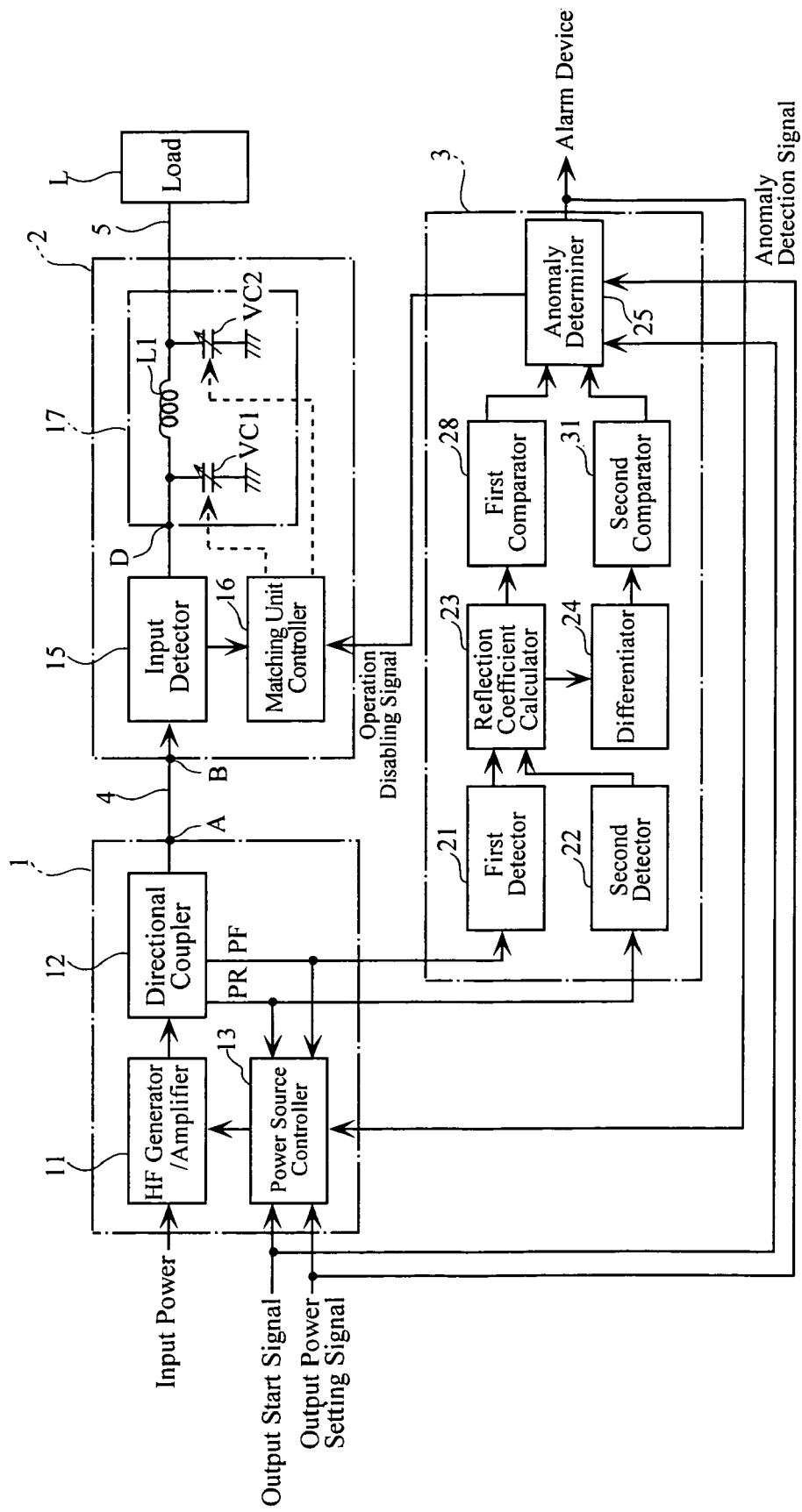
FIG. 7 shows a configuration of a high-frequency power supply system according to Embodiment 4 of the present invention.

FIG. 7 shows a configuration of a high-frequency power supply system according to Embodiment 4 of the present invention. In Embodiment 1, the differential value $d\Gamma/dt$ of the reflection coefficient $\Gamma$ is used to determine occurrence of anomalies. In Embodiment 4, both of the reflection coefficient $\Gamma$ and the differential value $d\Gamma/dt$ of the reflection coefficient $\Gamma$ are used for anomaly occurrence determination. Specifically, FIG. 7 differs from FIG. 1 in that a first comparator 28 is provided between the reflection coefficient calculator 23 and the anomaly determiner 25, and that a second comparator 29 is provided between the differentiator 24 and the anomaly determiner 25.

The first comparator 28 is supplied with the reflection coefficient $\Gamma$ which is calculated by the reflection coefficient calculator 23. The second comparator 29 is supplied with the differential value $d\Gamma/dt$ of the reflection coefficient $\Gamma$ which is calculated by the differentiator 24.

The second comparator 29 compares the differential value $d\Gamma/dt$ of the reflection coefficient $\Gamma$ from the differentiator 24 with a first predetermined reference value. When the differential value $d\Gamma/dt$ of the reflection coefficient $\Gamma$ has exceeded the first reference value, the second comparator outputs an indication signal (by turning a LOW level signal to HIGH level for example). This signal is inputted to the anomaly determiner 25.

The first comparator 28 compares the magnitude of the reflection coefficient $\Gamma$ inputted from the reflection coefficient calculator 23 with a second predetermined reference value. When the magnitude of the reflection coefficient $\Gamma$ has exceeded the second reference value, the first comparator outputs an indication signal (by turning a LOW level signal to HIGH level for example). This signal is also inputted to the anomaly determiner 25.

The anomaly determiner 25 has an unillustrated AND circuit. The AND circuit produces a logical multiplication of the signals from the first comparator 28 and the second comparator 29, and outputs a resulting signal as an anomaly detection signal. Specifically, if both of the signals inputted from the first comparator 28 and the second comparator 29 are HIGH level, the anomaly determiner 25 outputs a HIGH level signal whereas the anomaly determiner 25 outputs a LOW level signal if either of the signals inputted from the first comparator 28 and the second comparator 29 is LOW level. The high-low relationship of the signal in the anomaly determiner 25 may be reverse.

In the high-frequency power supply system according to Embodiment 4, the differential value $d\Gamma/dt$ of the reflection coefficient $\Gamma$ and the reflection coefficient $\Gamma$ are respectively compared with the first reference value and the second reference value in the anomaly determiner 25, and an occurrence of anomaly is determined when both of the parameters have exceeded their respective reference values. All the other operations are identical with those in Embodiment 1, and therefore the description will not be repeated here.

As described, in Embodiment 4, anomaly occurrence determination is made not only on the basis of the reflection coefficient differential value $d\Gamma/dt$ but also on the basis of the reflection coefficient $\Gamma$. For example, the system determines that an anomaly exists if the reflection coefficient differential value $d\Gamma/dt$ is large and the reflection coefficient $\Gamma$ is large.

In the above, the anomaly determiner 25 determines presence of an anomaly using an AND operation between the comparison result from the first comparator 28 and the comparison result from the second comparator 29, i.e. when the differential value $d\Gamma/dt$ of the reflection coefficient $\Gamma$ has exceeded the first reference value and the reflection coefficient $\Gamma$ has exceeded the second reference value. Alternatively, the determiner may use an OR operation between the comparison result from the first comparator 28 and the comparison result from the second comparator 29. Specifically, the anomaly determiner may determine presence of an anomaly when the differential value $d\Gamma/dt$ of the reflection coefficient $\Gamma$ has exceeded a first reference value or the reflection coefficient $\Gamma$ has exceeded a second reference value.

Figure 8:
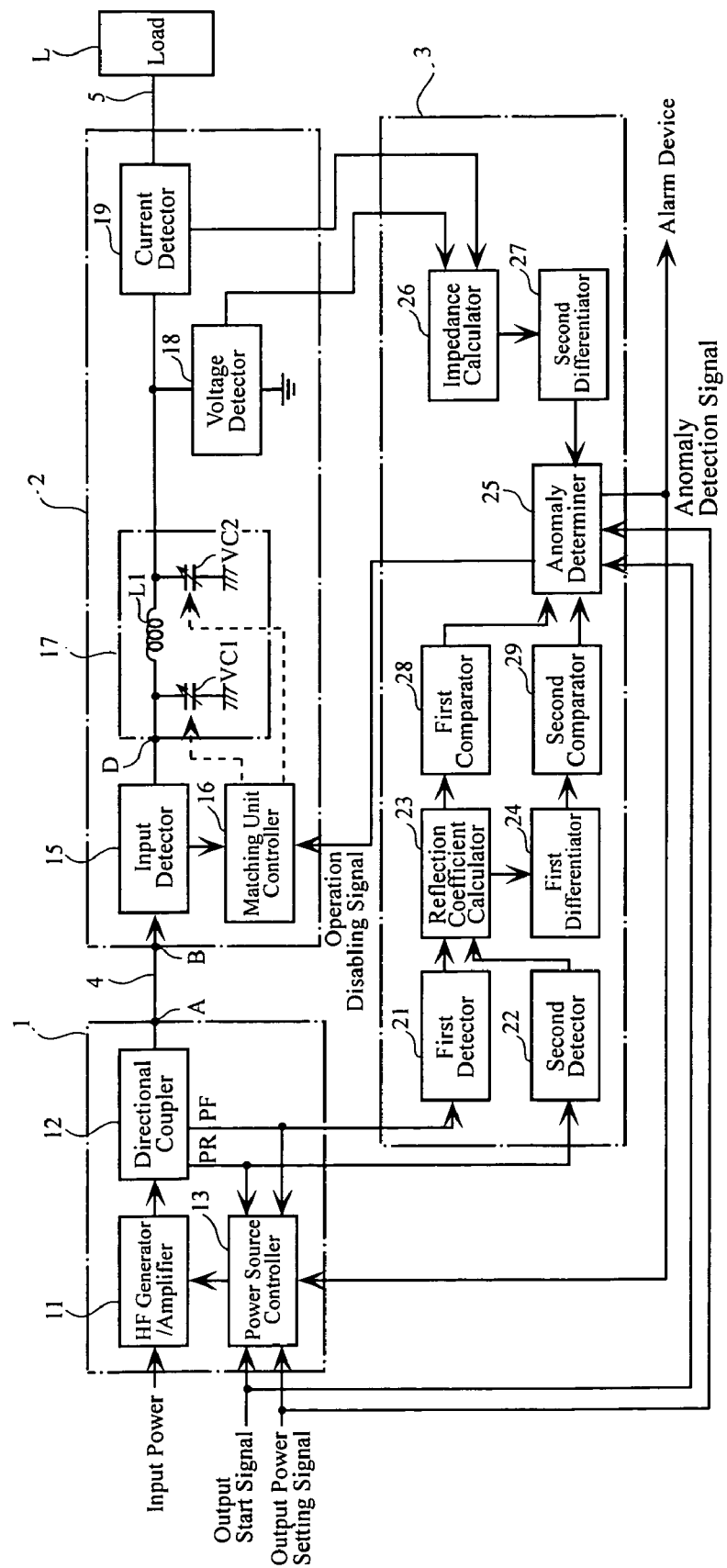
FIG. 8 shows a configuration of a high-frequency power supply system according to Embodiment 5 of the present invention.

FIG. 8 shows a configuration of a high-frequency power supply system according to Embodiment 5 of the present invention. In Embodiment 4, anomaly determining operation is made by using the magnitude of reflection coefficient $\Gamma$ and the differential value $d\Gamma/dt$ of the reflection coefficient $\Gamma$. In Embodiment 5, anomaly determining operation is made by using both of the magnitude of the reflection coefficient $\Gamma$ and the differential value $d\Gamma/dt$ of the reflection coefficient $\Gamma$, and the differential value $dZ/dt$ of the impedance Z. Specifically, FIG. 8 shows a configuration which differs from Embodiment 4 in FIG. 7 in that the impedance matching unit 2 is provided with a voltage detector 18 and a current detector 19 whereas the anomaly detector 3 is provided with an impedance calculator 26 and a second differentiator 27.

In Embodiment 5, the first comparator 28 and the second comparator 29 compare the differential value $d\Gamma/dt$ of the reflection coefficient $\Gamma$ and the magnitude of reflection coefficient $\Gamma$ with a first reference value and a second reference value respectively, and a HIGH level signal is outputted when both results of the comparison exceed the respective reference values. The anomaly determiner 25 in the anomaly detector 3 determines that an anomaly is present when both of the signals from the first comparator 28 and the second comparator 29 are HIGH level, and the differential value $dZ/dt$ of the impedance Z inputted from the second differentiator 27 exceeds a predetermined reference value. Otherwise, all the other operations are identical with those in Embodiment 1 and therefore, the description will not be repeated here.

As described, according to Embodiment 5, anomaly determining operation is based not only on the magnitude of reflection coefficient $\Gamma$ and the reflection coefficient differential value $d\Gamma/d$ but also on the differential value $dZ/dt$ of the impedance Z and therefore, it is possible to detect anomalies in the load L more reliably and accurately.

In the above, the anomaly determiner 25 determines presence of anomalies using an AND operation between the comparison result from the first comparator 28, the comparison result from the second comparator 29 and the output from the second differentiator 27. In other words, an anomaly is determined to be present when the differential value $d\Gamma/dt$ of the reflection coefficient $\Gamma$ has exceeded the first reference value, the reflection coefficient $\Gamma$ has exceeded the second reference value, and the differential value $dZ/dt$ of the impedance Z has exceeded a third reference value. Alternatively, the determiner may use an OR operation between the comparison result from the first comparator 28, the comparison result from the second comparator 29 and the output from the second differentiator 27; i.e. the anomaly determiner may determine presence of an anomaly when the differential value dΓ/dt of the reflection coefficient Γ has exceeded the first reference value, the reflection coefficient Γ has exceeded the second reference value or the differential value dZ/dt of the impedance Z has exceeded the third reference value.

Figure 9:
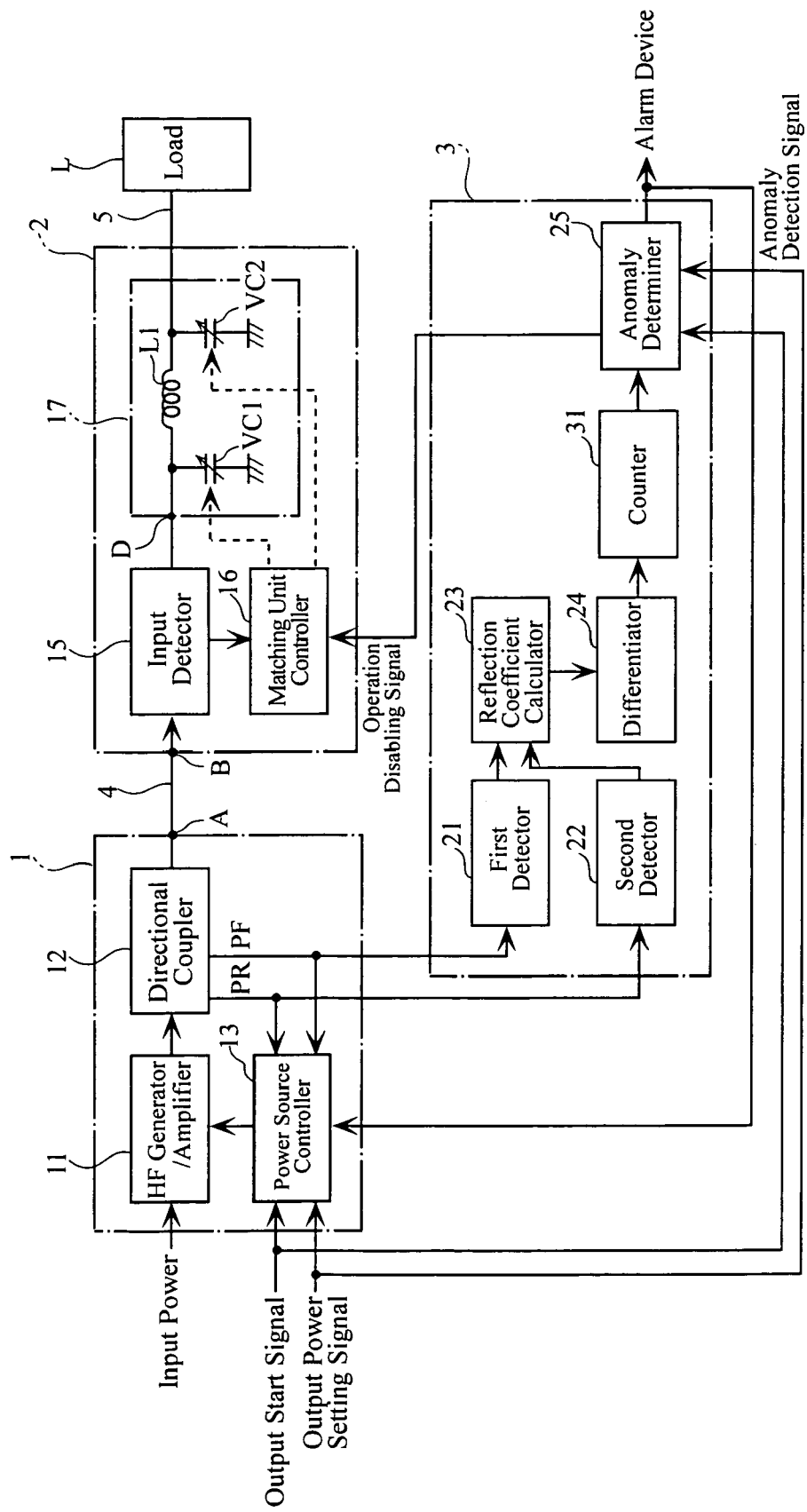
FIG. 9 shows a configuration of a high-frequency power supply system according to Embodiment 6 of the present invention.

FIG. 9 shows a configuration of a high-frequency power supply system according to Embodiment 6 of the present invention. In Embodiment 1, presence of an anomaly is determined right at the time when the differential value dΓ/dt of the reflection coefficient Γ has exceeded a first predetermined reference value. In Embodiment 6, each time the differential value dΓ/dt of the reflection coefficient Γ exceeds the first reference value, the event is counted and presence of an anomaly is determined when the number of events has exceeded a predetermined number. Therefore, the embodiment has a configuration shown in FIG. 9, which is essentially the same as FIG. 1 except for addition of a counter 31 between the differentiator 24 and the anomaly determiner 25. All the other aspects of the configuration is the same as of the high-frequency power supply system according to Embodiment 1, so description will be made only for the differences from Embodiment 1, i.e. operation of the counter 31 and of the anomaly determiner 25.

Figure 10:
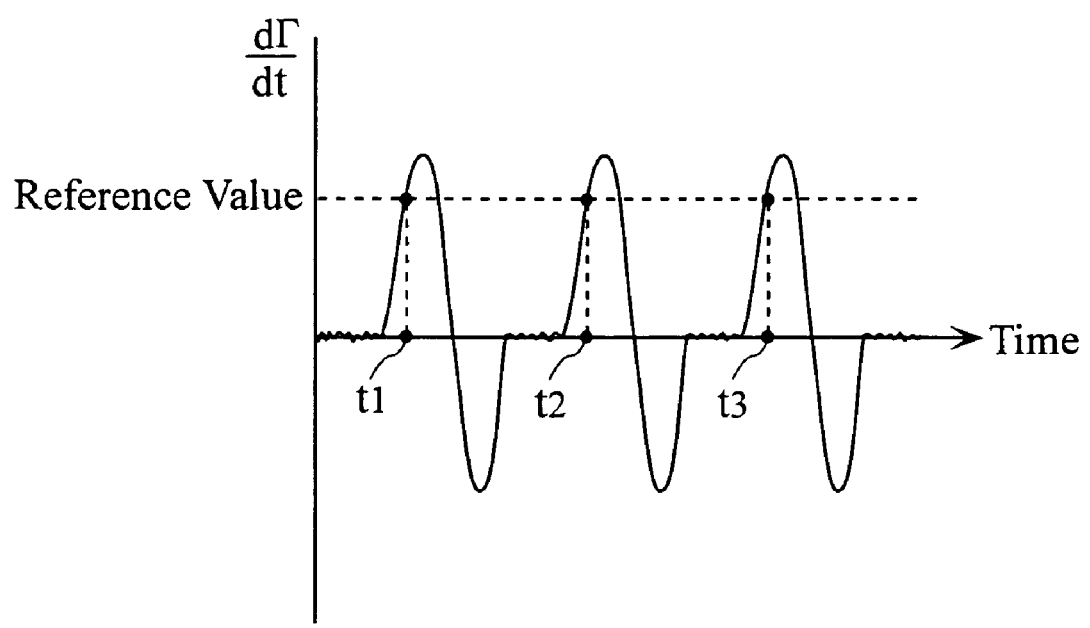
FIG. 10 shows a relationship between reflection coefficient differential values and a reference value.

The counter 31 in FIG. 9 compares the differential value dΓ/dt of the reflection coefficient Γ calculated at the differentiator 24 with a first predetermined reference value, and counts the number of times when the differential value dΓ/dt has exceeded the first reference value. Specifically, take a case where the differential value dΓ/dt of the reflection coefficient Γ makes changes as shown in FIG. 10. The counter 31 increases its count by an increment of one each time the differential value dΓ/dt of the reflection coefficient Γ exceeds the first reference value, i.e. at Time Points t1, t2 and t3, and outputs the value of the count to the anomaly determiner 25.

The anomaly determiner 25 determines that an anomaly exists when the value of the count inputted from the counter 31 has exceeded the first reference value.

Figure 25:
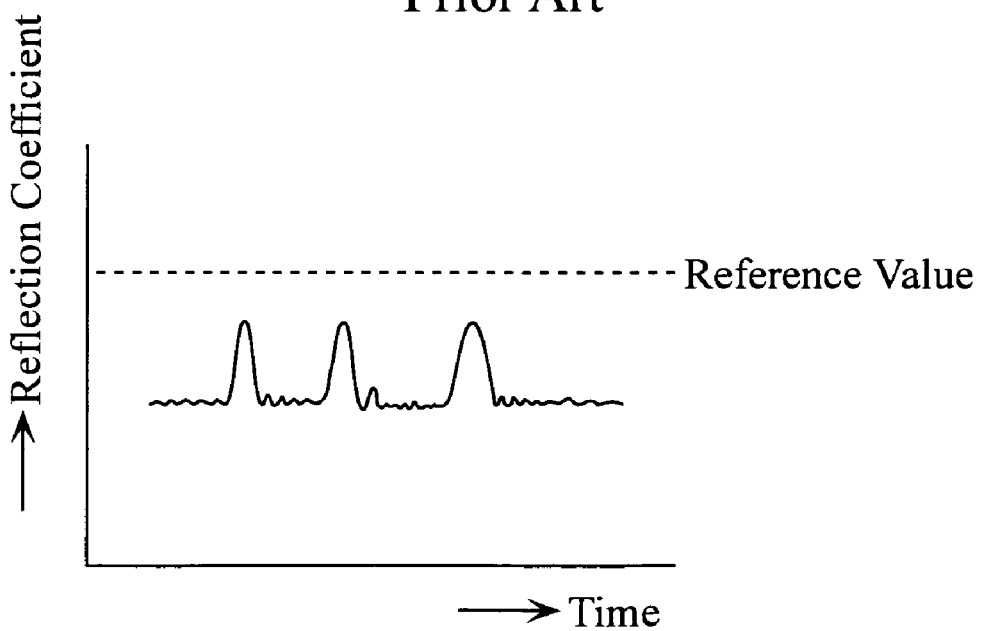
FIG. 25 shows another relationship between reflection coefficient and time in the conventional system.

In Embodiment 6, presence of an anomaly is determined when the differential value dΓ/dt of the reflection coefficient Γ has exceeded a first reference value more times than a predetermined norm number, whereupon responses are made including anomaly alarm and stoppage of the high-frequency power output. This arrangement enables early-stage detection of anomalies and damage prevention when e.g. the reflection coefficient Γ surges intermittently as shown in FIG. 25, i.e. a case where each surge in the reflection coefficient Γ will cause a minor damage to the high-frequency power transmission circuit, and accumulation of the damages will eventually lead to a catastrophic damage.

Embodiment 6 may be varied to a configuration similar to Embodiment 4. (See FIG. 7) which takes into account the magnitude of reflection coefficient Γ in addition to the differential value dΓ/dt of the reflection coefficient Γ. In this case, the configuration in FIG. 9 will further include a counter (not illustrated) between the reflection coefficient calculator 23 and the anomaly determiner 25. The counter counts the number of times when the magnitude of reflection coefficient Γ has exceeded a second predetermined reference value, and inputs a result of the counting to the anomaly determiner 25. Then, the anomaly determiner 25 determines that an anomaly exists when the differential value dΓ/dt of the reflection coefficient Γ has exceeded the first reference value more times than a first predetermined norm number and the reflection coefficient Γ has exceeded the second reference value more times than a second predetermined norm number. Alternatively, the anomaly determiner determines that an anomaly exists when the differential value dΓ/dt of the reflection coefficient Γ has exceeded the first reference value more times than a first predetermined norm number or when the reflection coefficient Γ has exceeded the second reference value more times than a second predetermined norm number.

Figure 11:
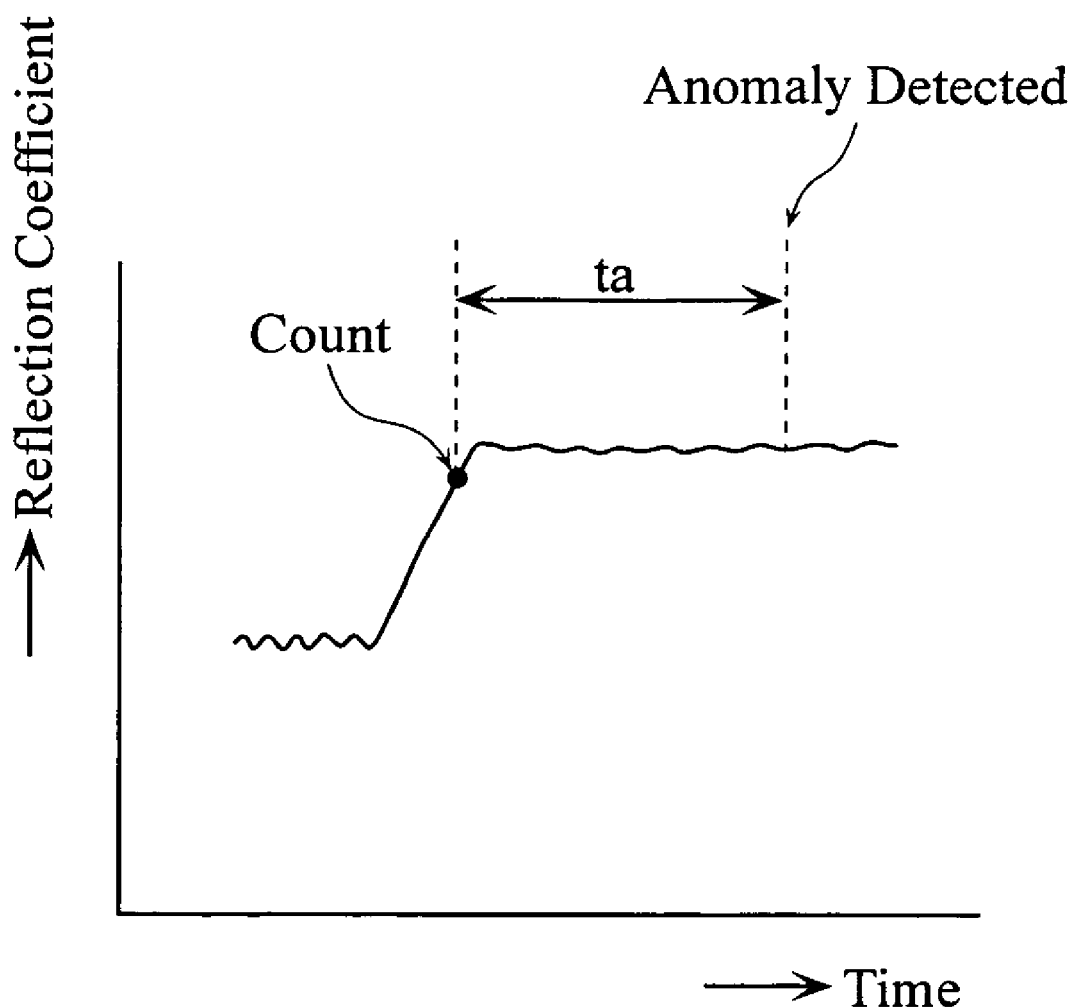
FIG. 11 shows a relationship between reflection coefficient and time, for describing a variation of Embodiment 6.

Now, in Embodiment 6, an anomaly is affirmed when the differential value dΓ/dt of the reflection coefficient Γ has exceeded a predetermined reference value more times than a predetermined norm number. This method can pose a disadvantage however, when the reflection coefficient Γ changes in steps as shown in FIG. 11. In this particular case, the counter 31 will keep its count value as "1" and therefore the anomaly determiner 25 will not determine an occurrence of an anomaly. Yet a state of continuously high reflection coefficient indicates a high probability for presence of an anomaly, so there is likelihood that the anomaly determiner 25 will overlook an occurrence of anomaly.

Problems such as the above can be solved by the following arrangement: Specifically, if the magnitude of reflection coefficient Γ at the time of the first count is not smaller than a predetermined value and this state continues for a predetermined time period ta (See FIG. 11), the system will determine that an anomaly exists.

Figure 12:
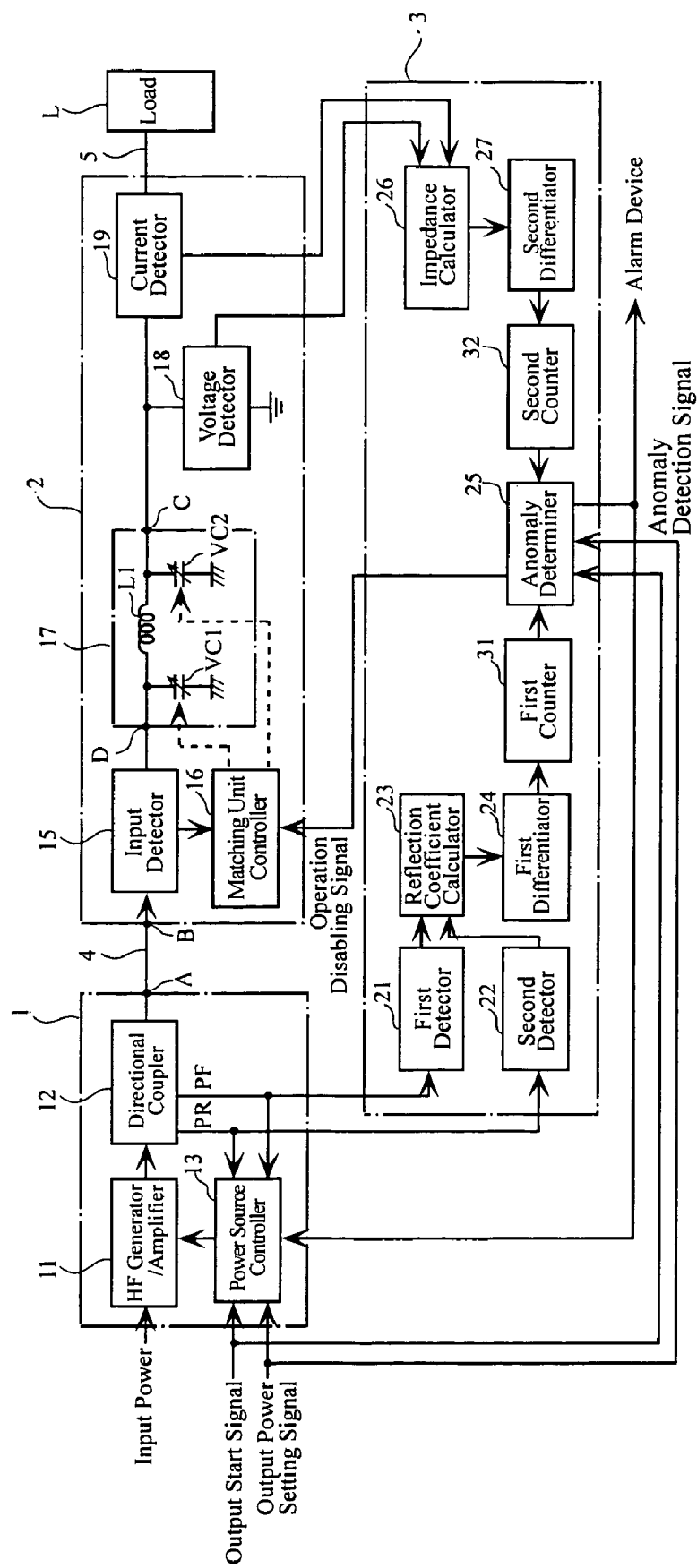
FIG. 12 shows a configuration of a high-frequency power supply system according to Embodiment 7 of the present invention.

FIG. 12 shows a high-frequency power supply system according to Embodiment 7 of the present invention. In Embodiment 6, counting is made for a predefined event that the differential value dΓ/dt of the reflection coefficient Γ has exceeded a predetermined reference value, and presence of an anomaly is determined as soon as the number of events has exceeded a predetermined norm number. In Embodiment 7, counting is made for the event that the differential value dΓ/dt of the reflection coefficient Γ has exceeded the predetermined reference value, and counting is also made for another predefined event that the differential value dZ/dt of the impedance Z has exceeded a predetermined reference value. Presence of an anomaly is determined when both of the counts on the number of events have exceeded the respective predetermined norm numbers. Therefore, the present embodiment has a configuration shown in FIG. 12, which is essentially the same as Embodiment 6 in FIG. 9 except that the impedance matching unit 2 is provided with a voltage detector 18 and a current detector 19, the anomaly detector 3 is provided with an impedance calculator 26 and a second differentiator 27, and a second counter 31 is provided between the second differentiator 27 and the anomaly determiner 25. Note that the counter 31 which appears in FIG. 9 is called as "the first counter 31" when reference is made to FIG. 12.

Figure 13:
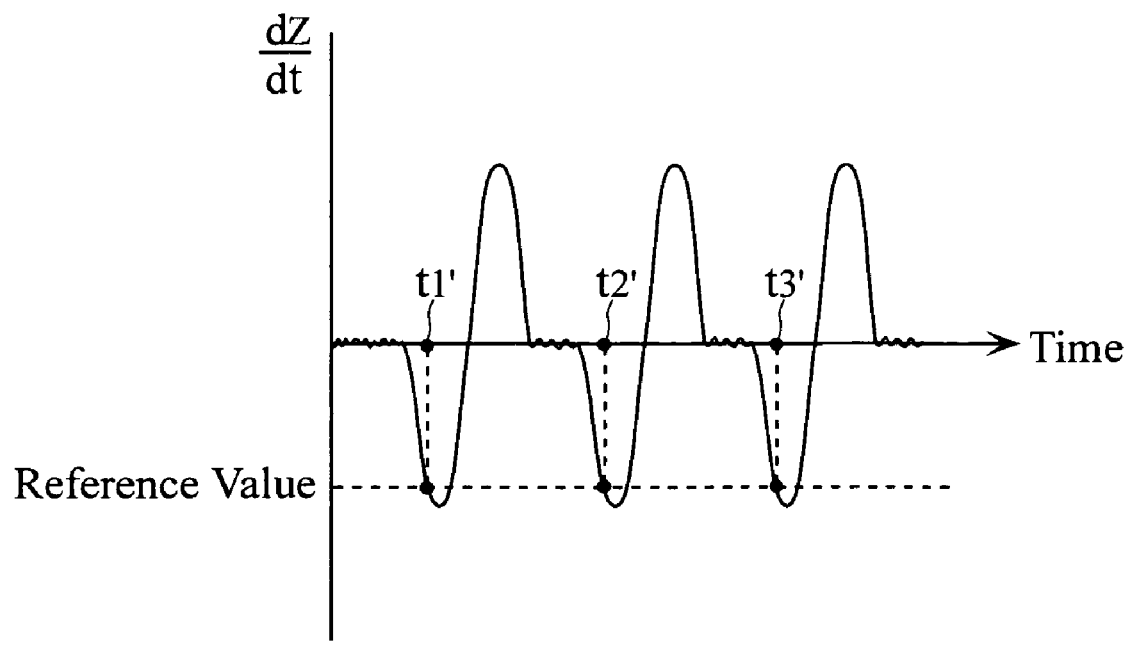
FIG. 13 shows a relationship between impedance differential value and a reference value.
Figure 14:
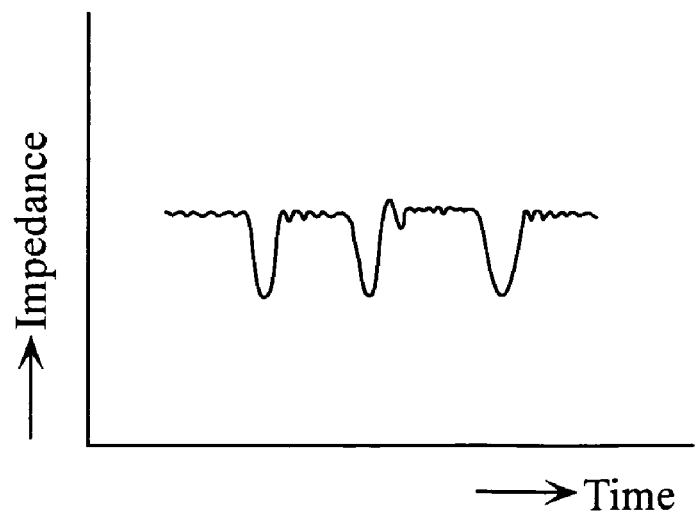
FIG. 14 shows a relationship between impedance and time.

The second counter 32 compares the differential value dZ/dt of the impedance Z calculated by the second differentiator 27 with a third predetermined reference value, and counts the number of times when the differential value dZ/dt has exceeded the third reference value. Specifically, take a case where the differential value dZ/dt of the impedance Z makes changes as shown in FIG. 13. The second counter 32 increases its count by an increment of one each time the differential value dZ/dt of the impedance Z has exceeded the third reference value, i.e. at Time Points t1', t2' and t3', and outputs the value of the count to the anomaly determiner 25.

The anomaly determiner 25 determines that an anomaly exists when the value of the count inputted from the first counter 31 has exceeded a first reference value and the value of the count inputted from the second counter 32 has exceeded a third reference value.

In Embodiment 7, presence of an anomaly is determined when the differential value dΓ/dt of the reflection coefficient Γ has exceeded the first reference value more times than the first norm number and the differential value dZ/dt of the impedance Z has exceeded the third reference value more times than the third predetermined number. The determination triggers anomaly alarm and stoppage of the high-frequency power output. This arrangement enables early-stage detection of anomalies and damage prevention when e.g. the reflection coefficient Γ surges intermittently as shown in FIG. 25, where each surge in the reflection coefficient Γ will cause a minor damage to the high-frequency power transmission circuit and accumulation of the damages will eventually lead to a catastrophic damage.

Embodiment 7 may be varied to a configuration similar to Embodiment 4 (See FIG. 7) which takes into account the magnitude of reflection coefficient Γ in addition to the differential value dΓ/dt of the reflection coefficient Γ. In this case, the configuration in FIG. 9 will further include a counter (not illustrated) between the reflection coefficient calculator 23 and the anomaly determiner 25. The counter counts the number of times when the magnitude of reflection coefficient Γ exceeds a second predetermined reference value, and inputs a result of the counting to the anomaly determiner 25. Then, the anomaly determiner 25 determines that an anomaly exists when the differential value dΓ/dt of the reflection coefficient Γ has exceeded the first reference value more times than a first predetermined norm number, the reflection coefficient Γ has exceeded the second reference value more times than a second predetermined norm number, and the magnitude of reflection coefficient Γ has exceeded the second predetermined reference value more times than a second norm number. Alternatively, the anomaly determiner determines that an anomaly exists when the differential value dΓ/dt of the reflection coefficient Γ has exceeded a first reference value more times than a first predetermined norm number, when the reflection coefficient Γ has exceeded a second reference value more times than a second predetermined norm number, or when the magnitude of reflection coefficient Γ has exceeded a second predetermined reference value more times than a second norm number.

Now, in Embodiment 7, an anomaly is affirmed when the differential value dZ/dt of the impedance Z has exceeded a predetermined reference value more times than a predetermined norm number. This method can pose a disadvantage however, when the impedance Z changes in steps. In such a case, the second counter 32 will keep its count value as "1", yet a state of continuously low impedance Z indicates a high probability for presence of an anomaly, so there is likelihood that the anomaly determiner 25 will overlook an occurrence of anomaly.

Problems such as the above can be solved by the following arrangement: Specifically, if the magnitude of impedance Z at the time of the first count is not greater than a predetermined value and this state continues for a predetermined time period, the anomaly determiner 25 will receive a signal indicating the situation, and the anomaly determiner 25 determines that an anomaly exists when there is also an output from the first counter 31 indicating a similar situation happening in the reflection coefficient Γ.

Figure 15:
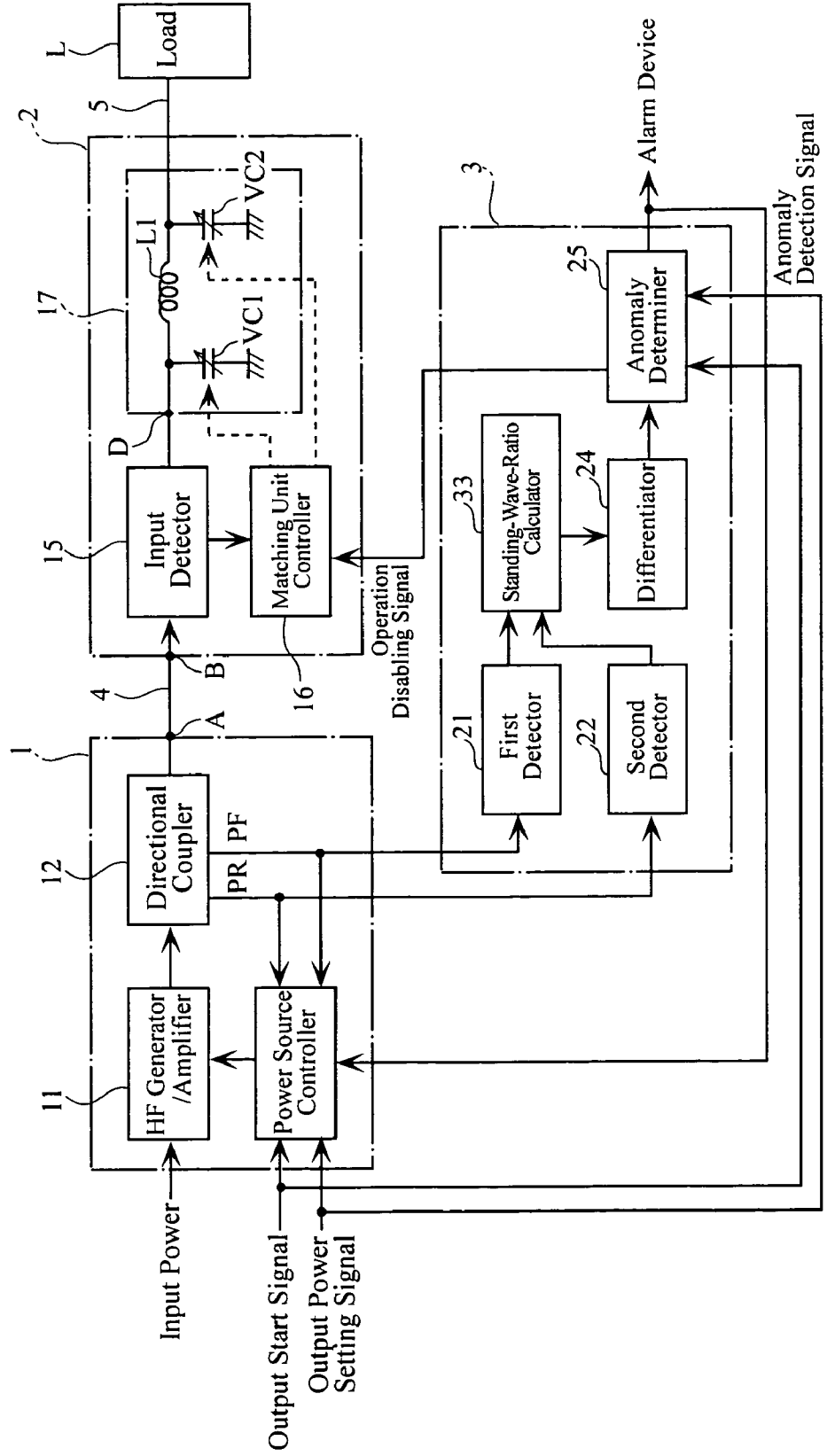
FIG. 15 shows a configuration of a high-frequency power supply system according to Embodiment 8 of the present invention.

FIG. 15 shows a high-frequency power supply system according to Embodiment 8 of the present invention. In place of the differential value dΓ/dt of the reflection coefficient Γ as a parameter for anomaly determination, Embodiment 8 uses a change per unit time of the magnitude of standing wave ratio (hereinafter called standing wave ratio differential value dS/dt). Therefore, the present embodiment has a configuration shown in FIG. 15 which is essentially the same as in FIG. 1, differing in that the reflection coefficient calculator 23 is replaced by a standing-wave-ratio calculator 33. Since all the other aspects of the configuration are identical with those in Embodiment 1, description will only cover the standing-wave-ratio calculator 33 briefly.

The reflection coefficient Γ is expressed as Γ=Vr/Vf, and the relationship between the reflection coefficient Γ and the standing wave ratio S is expressed as S=(1+Γ)/(1−Γ). Therefore, the standing wave ratio S can be calculated as S=(Vf+Vr)/(Vf−Vr). Thus, the standing-wave-ratio calculator 33 calculates S=(Vf+Vr)/(Vf−Vr) by using the amplitude Vf of the forward wave PF inputted from the first detector 21 and the amplitude Vr of the reflected wave PR inputted from the second detector 22, thereby obtaining the standing wave ratio S.

The magnitude of the standing wave ratio S obtained by the**standing-wave-ratio calculator 33 is inputted to the differentiator 24, and the differentiator 24 calculates the differential value dS/dt of the standing wave ratio S. The anomaly determiner 25 compares the differential value dS/dt of the standing wave ratio S calculated by the differentiator 24 with a predetermined reference value. The anomaly determiner determines that an anomaly exists when the differential value dS/dt is greater than the reference value, and outputs an anomaly detection signal which may be a signal turned to HIGH level.

Embodiment 8 uses the standing wave ratio S as the parameter for anomaly determination. Both the standing wave ratio S and the reflection coefficient Γ represent a ratio to the forward wave, which indicates a ratio of the reflected wave or a degree of matching. If the degree of the reflected wave is abnormally large or the degree of matching is abnormally decreased, it is likely that an anomaly is present in the circuit. Thus, Embodiment 8 also offers the same functions and advantages as achieved by Embodiment 1.

Embodiment 8 uses the differential value dS/dt of the standing wave ratio S as the parameter for anomaly determination. Alternatively, the parameter may be provided by the change per unit time of the reciprocal of the standing wave ratio S, i.e. d(1/S)/dt.

Figure 16:
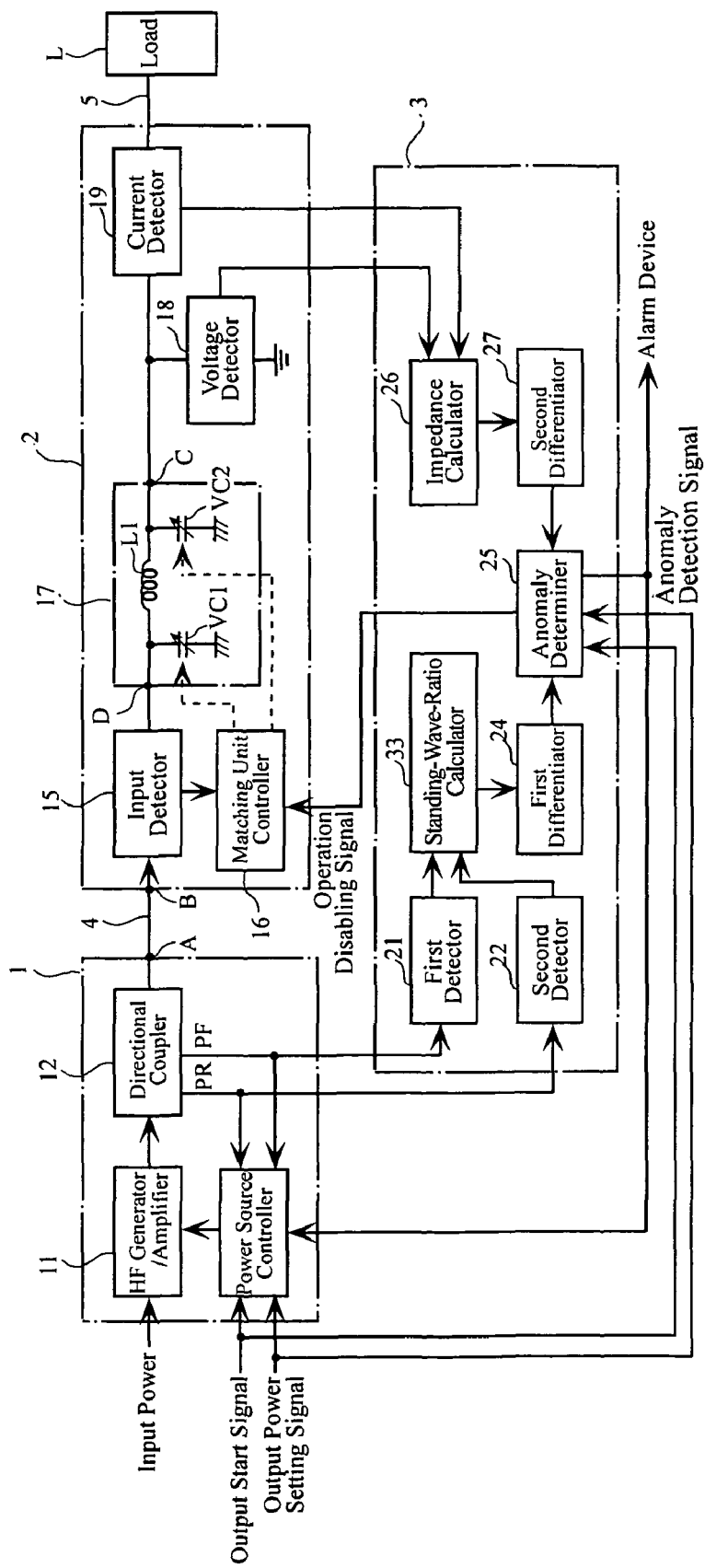
FIG. 16 shows a configuration of a high-frequency power supply system according to Embodiment 9 of the present invention.

FIG. 16 shows a high-frequency power supply system according to Embodiment 9. In Embodiment 8, anomalies are detected on the basis of the differential value dS/dt of the standing wave ratio S. In Embodiment 9, the differential value dS/dt of the standing wave ratio S and the differential value dZ/dt of the impedance Z are used in determining anomalies. Specifically, FIG. 16 shows a configuration which is essentially the same as Embodiment 8 in FIG. 15, differing in that the impedance matching unit 2 is provided with a voltage detector 18 and a current detector 19, and the anomaly detector 3 is provided with an impedance calculator 26 and a second differentiator 27.

The anomaly determiner 25 in the anomaly detector 3 according to Embodiment 9 compares the differential value dS/dt of the standing wave ratio with a first reference value, while comparing the differential value dZ/dt of the impedance Z with a second reference value, and determines that an anomaly exists if both parameters exceed their respective reference values. All the other operations are identical with those in Embodiment 8, and therefore the description will not be repeated here.

As described, according to Embodiment 9, anomaly determining operation is based not only on the differential value dS/dt of the standing wave ratio but also on the differential value dZ/dt of the impedance Z and therefore, it is possible to detect anomalies in the load L more reliably and accurately.

Embodiment 9 uses the differential value dS/dt of the standing wave ratio S as the parameter for anomaly determination. Alternatively, the parameter may be provided by the change per unit time of the reciprocal of the standing wave ratio S, i.e. d(1/S)/dt.

Figure 17:
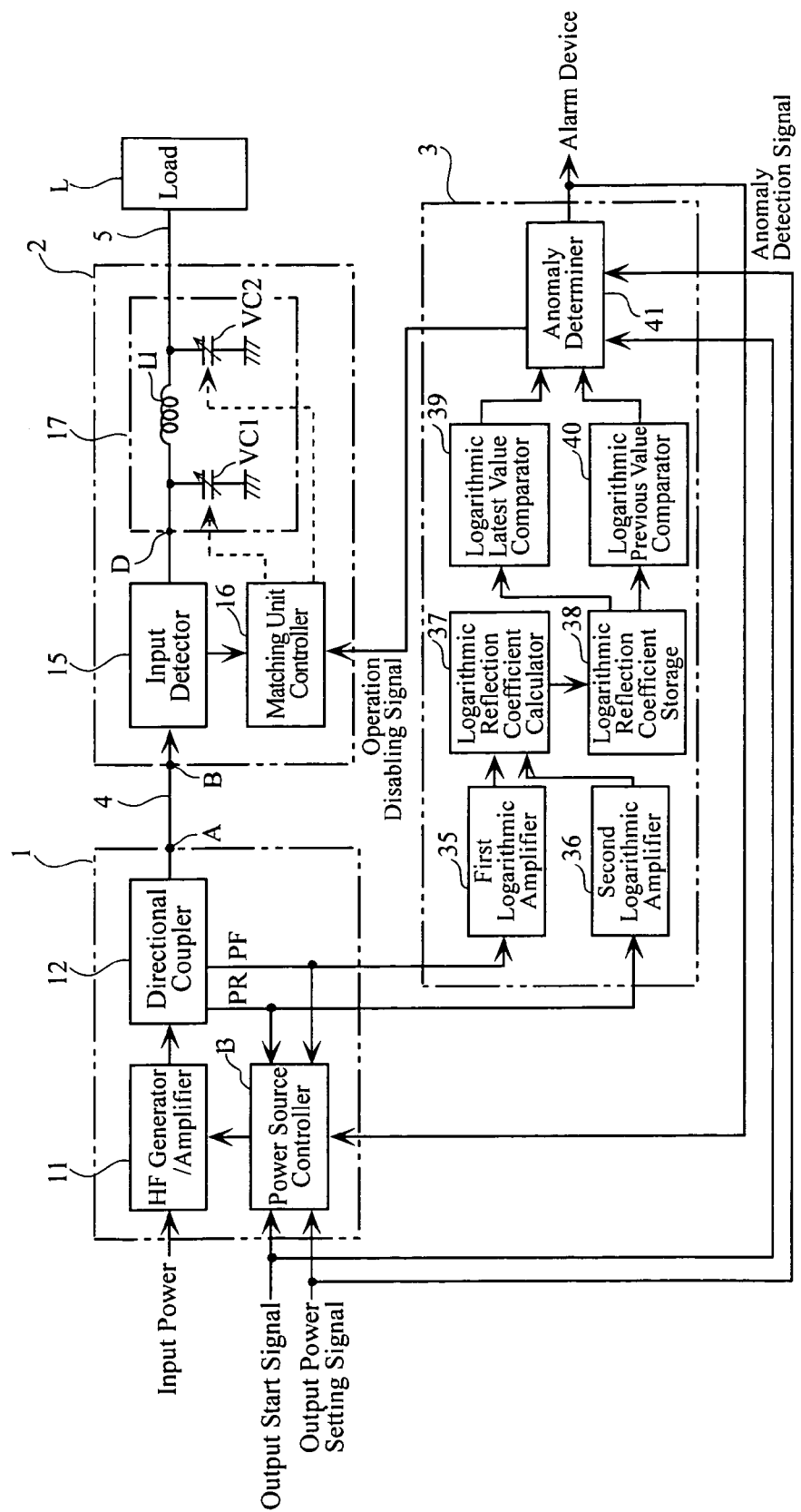
FIG. 17 shows a configuration of a high-frequency power supply system according to Embodiment 10 of the present invention.

FIG. 17 shows a configuration of a high-frequency power supply system according to Embodiment 10 of the present invention. In Embodiments 1 through 9, occurrence of anomalies is determined on the basis of the differential value $d\Gamma/dt$ of the reflection coefficient $\Gamma$. In Embodiment 10, a logarithm of the reflection coefficient $\Gamma$ is obtained, and occurrence of anomalies is determined on the basis of how this logarithm value changes per unit time.

Specifically, a high-frequency power supply system according to Embodiment 10 is shown in FIG. 1, with the anomaly detector 3 having the following configuration. The anomaly detector 3 according to Embodiment 10 includes a first logarithmic amplifier 35, a second logarithmic amplifier 36, a logarithmic reflection coefficient calculator 37, a logarithmic reflection coefficient storage 38, a logarithmic latest value comparator 39, a logarithmic previous value comparator 40 and an anomaly determiner 41.

The first logarithmic amplifier 35 rectifies the amplitude Vf of the forward wave PF and outputs a logarithm value that represents the amplitude Vf. The second logarithmic amplifier 36 rectifies the amplitude Vr of the reflected wave PR and outputs a logarithm value that represents the amplitude Vr. The first logarithmic amplifier 35 and the second logarithmic amplifier 36 are each provided by e.g. the same circuitry as used for the first detector 21 and the second detector 22 in Embodiment 1 (See FIG. 1), with an addition of a logarithm amplifying circuit provided by an OP amplifier and a diode connected in parallel therewith. The first logarithmic amplifier 35 and the second logarithmic amplifier 36 may be provided by commercially available logarithmic amplifiers. The values outputted from the first logarithmic amplifier 35 and the second logarithmic amplifier 36, i.e. the logarithm value log(Vf) of the amplitude Vf of the forward wave PF and the logarithm value log(Vr) of the amplitude Vr of the reflected wave PR are inputted to the logarithmic reflection coefficient calculator 37.

The logarithmic reflection coefficient calculator 37 calculates the logarithm value log $\Gamma$(=log(Vr/Vf)) based on the logarithm value log(Vf) of the amplitude Vf of the forward wave PF inputted from the first logarithmic amplifier 35 and the logarithm value log(Vr) of the amplitude Vr of the reflected wave PR inputted from the second logarithmic amplifier 36. The logarithm value log $\Gamma$ of the reflection coefficient $\Gamma$ is inputted to the logarithmic reflection coefficient storage 38. An advantage of the logarithmic reflection coefficient calculator 37 is that the calculation of the logarithm value log(Vr/Vf) of the reflection coefficient $\Gamma$ can be made by subtraction, i.e. log(Vr)−log(Vf). In other words, there is no need for providing a division circuit for direct division of the amplitude Vr of the reflected wave PR by the amplitude Vf of the forward wave PF for example. This enables to simplify the circuit construction.

The logarithmic reflection coefficient calculator 37 may be an analog signal processor or a digital signal processor. For the digital signal processor, an unillustrated A/D converter is provided before the logarithmic reflection coefficient calculator 37. The logarithm value log $\Gamma$ of the reflection coefficient $\Gamma$ is calculated at a predetermined time interval $\Delta t$. If the processor is an analog signal processor, an unillustrated A/D converter is provided between the logarithmic reflection coefficient calculator 37 and a logarithmic reflection coefficient storage 38 which will be described next.

The logarithmic reflection coefficient storage 38 has an unillustrated memory for successive storage of the values of the logarithm value log $\Gamma$ of the reflection coefficient $\Gamma$ calculated by the logarithmic reflection coefficient calculator 37 at the predetermined time interval $\Delta t$. Each time a new input of the value of the logarithm value log $\Gamma$ of the reflection coefficient $\Gamma$ is made from the logarithmic reflection coefficient calculator 37 at a predetermined time interval $\Delta t$, the storage outputs the latest value i.e. said new logarithm value or log $\Gamma 1$ of a reflection coefficient $\Gamma 1$ and the previous value i.e. a logarithm value log $\Gamma 2$ of a reflection coefficient $\Gamma 2$. The logarithm value log $\Gamma 1$ of the reflection coefficient $\Gamma 1$ outputted from the logarithmic reflection coefficient storage 38 is inputted to the logarithmic latest value comparator 39 whereas the logarithm value log $\Gamma 2$ of the reflection coefficient $\Gamma 2$ is inputted to a logarithmic previous value comparator 40.

The logarithmic latest value comparator 39 compares the logarithm value log $\Gamma 1$ of the reflection coefficient $\Gamma 1$ from the logarithmic reflection coefficient storage 38 with a predetermined reference value, and outputs an indicating signal (a HIGH level signal for example) if the logarithm value log $\Gamma 1$ of the reflection coefficient $\Gamma 1$ is not smaller than the reference value. The signal is inputted to the anomaly determiner 41. The reference value as expressed in terms of the reflection coefficient $\Gamma$ will be 0.8 through 0.9 for example.

The logarithmic previous value comparator 40 compares the logarithm value log $\Gamma 2$ of the reflection coefficient $\Gamma 2$ from the logarithmic reflection coefficient storage 38 with a predetermined reference value, and outputs an indicating signal (a HIGH level signal for example) if the logarithm value log $\Gamma 2$ of the reflection coefficient $\Gamma 2$ is not greater than the reference value. The signal is inputted to the anomaly determiner 41. The reference value as expressed in terms of the reflection coefficient $\Gamma$ will be 0.2 through 0.3 for example.

Figure 18:
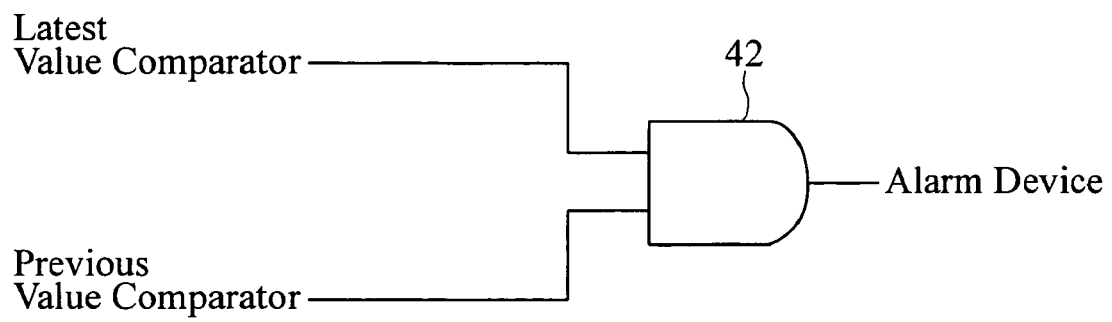
FIG. 18 shows a configuration of an anomaly determiner according to Embodiment 10 of the present invention.

In order to determine whether or not an anomaly exists from the outputs supplied by the logarithmic latest value comparator 39 and the logarithmic previous value comparator 40, the anomaly determiner 41 includes an AND circuit 42 as shown in FIG. 18 which outputs a logical multiplication of the signals from the logarithmic latest value comparator 39 and the logarithmic previous value comparator 40. The output from the AND circuit 42 is an anomaly detection signal. Specifically, if both of the signals inputted from the logarithmic latest value comparator 39 and the logarithmic previous value comparator 40 are HIGH level, the anomaly determiner 41 outputs a HIGH level signal which indicates presence of an anomaly. All the other operations are identical with those in Embodiment 1 and therefore description will not be repeated here. Note however, that the high-low relationship of the signal in the anomaly determiner 41 may be reversed.

Embodiment 10 uses the logarithm of reflection coefficient $\Gamma$ because obtaining a differential value of the reflection coefficient $\Gamma$ and comparing it with a reference value simply as in the previous embodiments will not lead to appropriate anomaly determination.

Figure 19:
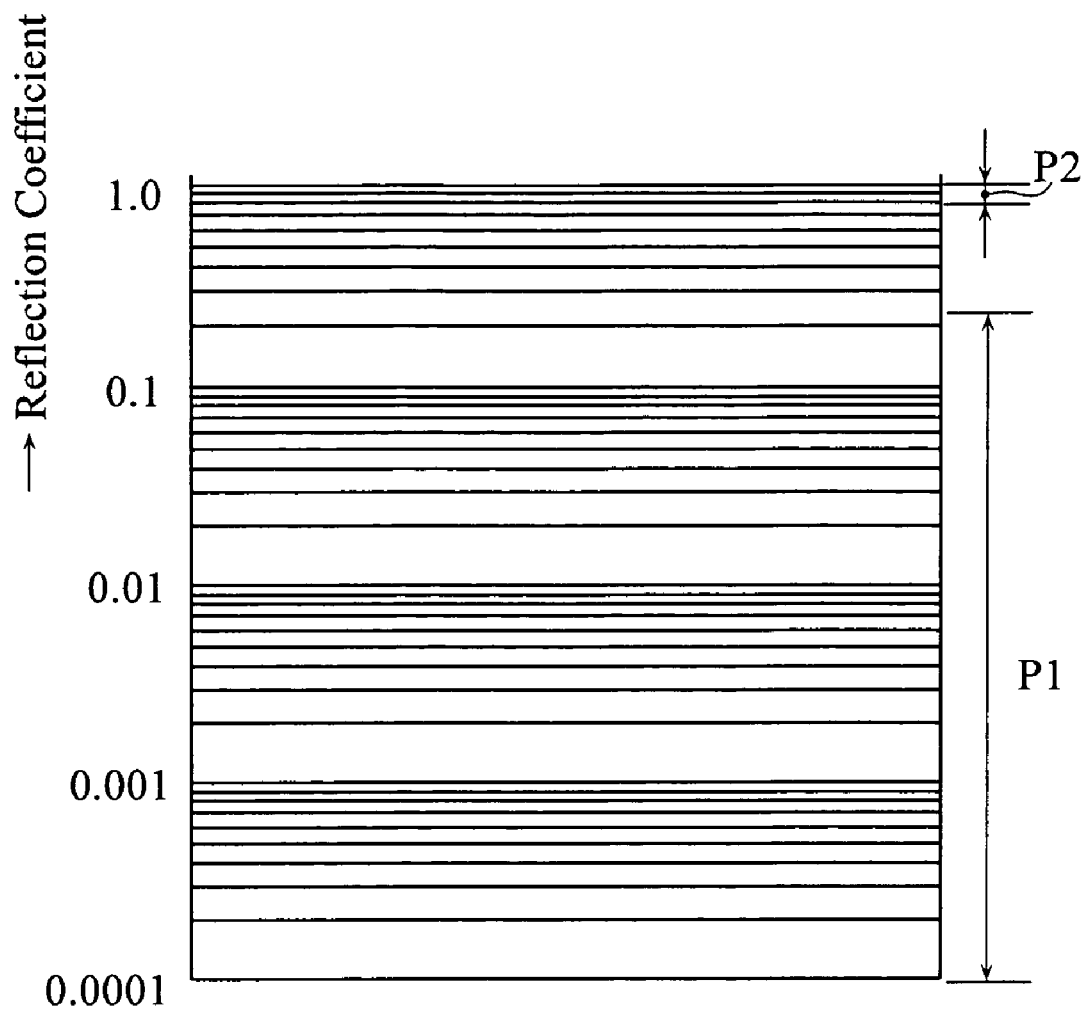
FIG. 19 shows a relationship between reflection coefficient and time.

Specifically, in Embodiment 10 which uses logarithm of reflection coefficient $\Gamma$, the logarithm value differential d(log $\Gamma$)/dt can be abnormally large even if an appropriate matching is established, the reflection coefficient $\Gamma$ is relatively small (essentially within the range P1 in FIG. 19) and the state should not be determined as abnormal. For example, if the reflection coefficient $\Gamma$ has changed from 0.01 to 0.04 within the time period $\Delta t$, the differential value of the logarithm of reflection coefficient $\Gamma$ will be log(0.04)−log(0.01)≈0.602, with the base of the logarithm being 10.

However, in a case where the situation should be determined as abnormal, such as when the reflection coefficient $\Gamma$ has changed from 0.2 to 0.8 in the time period $\Delta t$, the differential value of reflection coefficient $\Gamma$ is $\log(0.8)-\log(0.2) \approx 0.602$. As demonstrated, two differential values of reflection coefficient $\Gamma$ will be the same with each other if the two values representing the change in the reflection coefficient $\Gamma$ are different from each other but the change in the reflection coefficient $\Gamma$ occurs at the same rate. Thus, determining a situation as abnormal simply because the logarithm value differential value $d(\log \Gamma)/dt$ of the reflection coefficient $\Gamma$ has exceeded a certain predetermined reference value is likely to be a misjudgment.

In Embodiment 10 therefore, a situation is determined as abnormal when the logarithm value has changed instantaneously from a relatively small value to a large value. In other words, the latest value and the previous value are considered as the base for the anomaly determination in order to see how much change has occurred within the unit time, in the same manner as in calculating the differential value.

Specifically, a situation is determined as abnormal when the logarithm value $\log \Gamma 1$ of the reflection coefficient $\Gamma 1$ which is inputted from the logarithmic reflection coefficient storage 38 to the logarithmic latest value comparator 39 is not smaller than a predetermined reference value and the logarithm value $\log \Gamma 2$ of the reflection coefficient $\Gamma 2$ inputted from the logarithmic reflection coefficient storage 38 to the logarithmic previous value comparator 40 is not greater than a predetermined reference value. In other words, a situation is determined as abnormal when the logarithm value $\log \Gamma$ of the reflection coefficient $\Gamma$ as expressed in terms of the reflection coefficient $\Gamma$ has changed from within the range P1 to the range P2 in FIG. 19.

As has been described, anomaly determination in Embodiment 10 is based on the latest value of the reflection coefficient $\Gamma$ and the previous value thereof. This arrangement provides virtually the same advantage as offered by the determination methods based on the logarithm value differential value $d(\log \Gamma)/dt$, and it is possible to detect anomalies instantaneously. Further, use of logarithm enables to accept high-frequency input of the forward wave PF and the reflected wave PR from the directional coupler 12 over a wide range. For example, an input level range of 1-1000 V is a 0-3 V range in logarithm expression. Likewise, an input level range of 1-10000 V is a 0-4 V range in logarithm expression.

Figure 20:
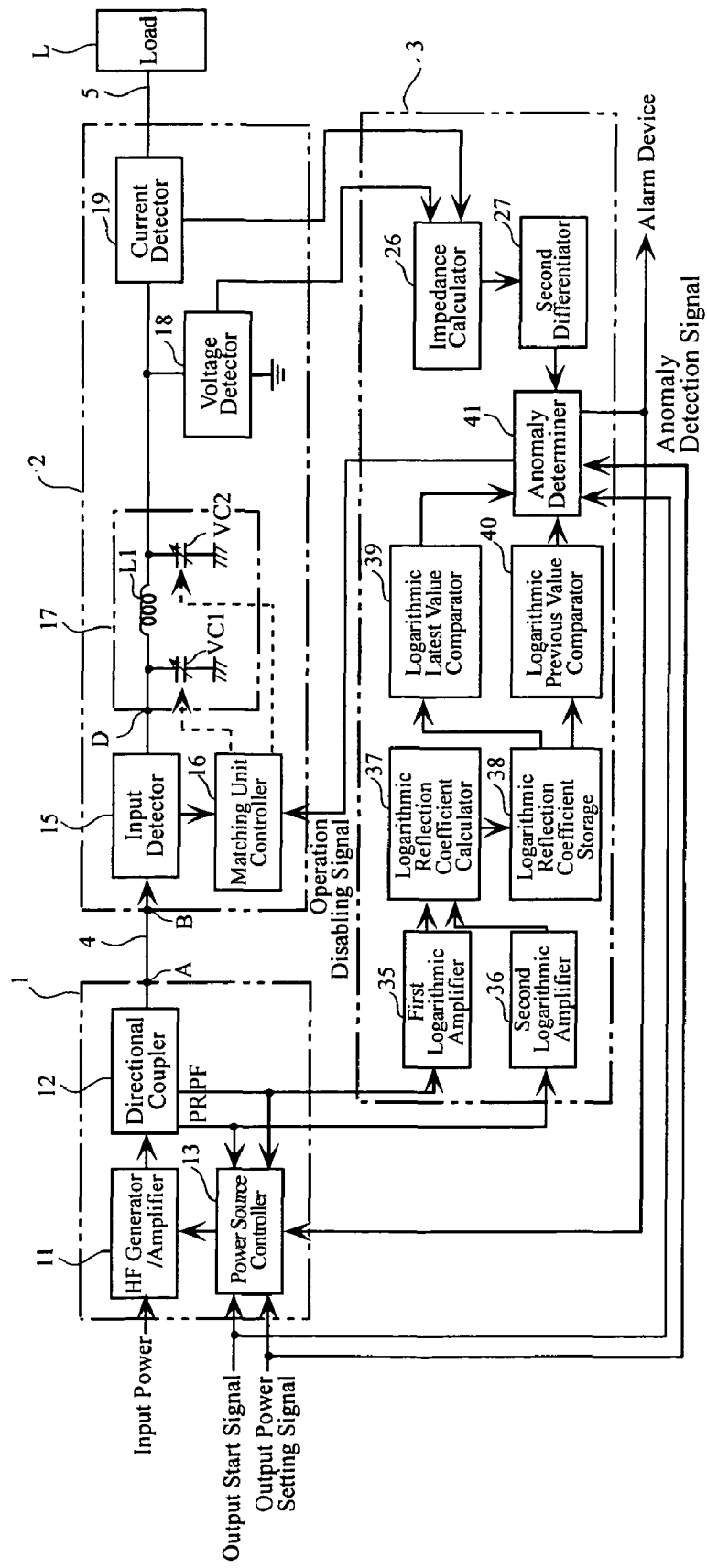
FIG. 20 shows a configuration of a high-frequency power supply system according to Embodiment 11 of the present invention.

FIG. 20 shows a configuration of a high-frequency power supply system according to Embodiment 11. In Embodiment 10, determination on an occurrence of an anomaly is based on a pattern of change per unit time which is derived from the logarithmic latest value and the logarithmic previous value of the reflection coefficient $\Gamma$. In addition to this, Embodiment 11 uses the differential value $dZ/dt$ of the impedance Z in anomaly occurrence determination. Specifically, a configuration in FIG. 20 is essentially the same as of Embodiment 11 in FIG. 17, differing in that the impedance matching unit 2 is provided with a voltage detector 18 and a current detector 19 whereas the anomaly detector 3 is provided with an impedance calculator 26 and the second differentiator 27.

According to Embodiment 11, the anomaly determiner 41 in the anomaly detector 3 determines that an anomaly exists when the logarithm value $\log \Gamma 1$ of the latest reflection coefficient $\Gamma 1$ which is inputted to the logarithmic latest value comparator 39 is not smaller than a predetermined reference value, the logarithm value $\log \Gamma 2$ of the previous reflection coefficient $\Gamma 2$ which is inputted to the logarithmic previous value comparator 40 is not greater than a predetermined reference value and the differential value $dZ/dt$ of the impedance Z which is inputted to the second differentiator 27 is greater than a predetermined reference value. All the other operations are identical with those in Embodiment 10, and therefore description will not be repeated here.

As described, according to Embodiment 11, anomaly occurrence determination is based not only on the pattern of change per unit time which is derived from the current and the logarithmic previous values of the reflection coefficient $\Gamma$ but also on the differential value $dZ/dt$ of the impedance Z and therefore, it is possible to detect anomalies in the load L more reliably and accurately.

Figure 21:
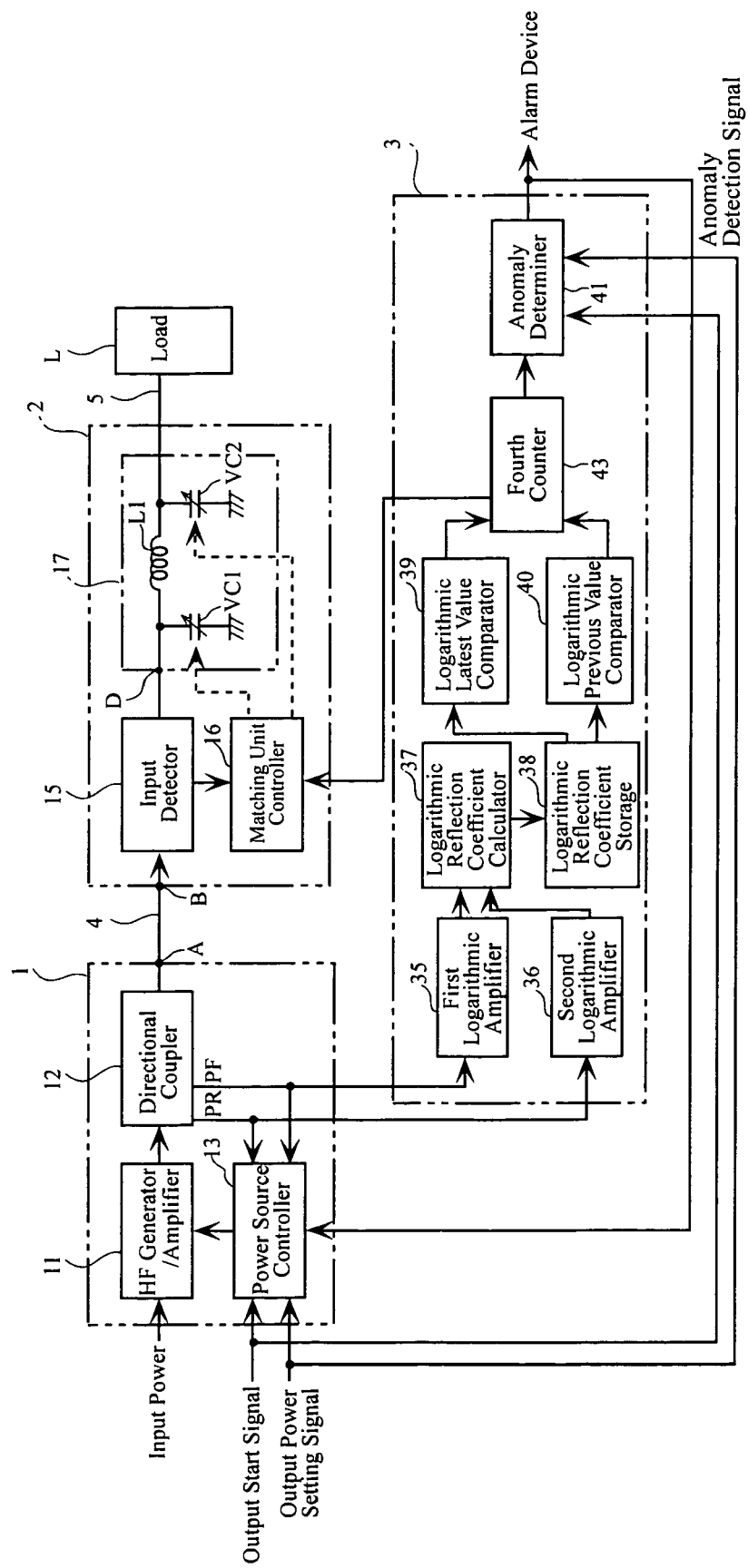
FIG. 21 shows a configuration of a high-frequency power supply system according to Embodiment 12 of the present invention.

FIG. 21 shows a configuration of a high-frequency power supply system according to Embodiment 12. In Embodiment 10, occurrence of anomalies is determined based on the pattern of change per unit time which is derived from the latest and the logarithmic previous values of the reflection coefficient $\Gamma$. In Embodiment 12, each time the logarithm value $\log \Gamma 1$ of the reflection coefficient $\Gamma 1$ which is inputted from the logarithmic reflection coefficient storage 38 to the logarithmic latest value comparator 39 exceeds a predetermined reference value, and the logarithm value $\log \Gamma 2$ of the reflection coefficient $\Gamma 2$ which is inputted from the logarithmic reflection coefficient storage 38 to the logarithmic previous value comparator 40 is smaller than a predetermined reference value, the event is counted, and presence of an anomaly is determined when the number of events has exceeded a predetermined norm number. Therefore, the present embodiment has a configuration shown in FIG. 21, which is essentially the same as in FIG. 17 except for addition of a counter 43 located after the outputting ends of the logarithmic latest value comparator 39 and the logarithmic previous value comparator 40, before the anomaly determiner 41.

The counter 43 in FIG. 21 counts the number of times when the logarithm value $\log \Gamma$ of the reflection coefficient $\Gamma$ which is inputted from the logarithmic reflection coefficient storage 38 to the logarithmic latest value comparator 39 is not smaller than a predetermined reference value, and the logarithm value $\log \Gamma 2$ of the reflection coefficient $\Gamma 2$ which is inputted from the logarithmic reflection coefficient storage 38 to the logarithmic previous value comparator 40 is not greater than a predetermined reference value.

The anomaly determiner 41 determines that an anomaly exists when the value of the count inputted from the counter 43 has exceeded a predetermined norm number. All the other operations are identical with those in Embodiment 10, and therefore description will not be repeated here.

As described, in Embodiment 12 the change per unit time derived from the latest and the previous values of the reflection coefficient $\Gamma$ is not taken as the decisive moment, and anomaly determination is based on the number of events which satisfies anomaly conditions. This arrangement enables early-stage detection of anomalies and damage prevention when e.g. the reflection coefficient $\Gamma$ surges intermittently as shown in FIG. 25, i.e. a case where each surge in the reflection coefficient $\Gamma$ will cause a minor damage to the high-frequency power transmission circuit, and accumulation of the damages will eventually lead to a catastrophic damage.

Figure 22:
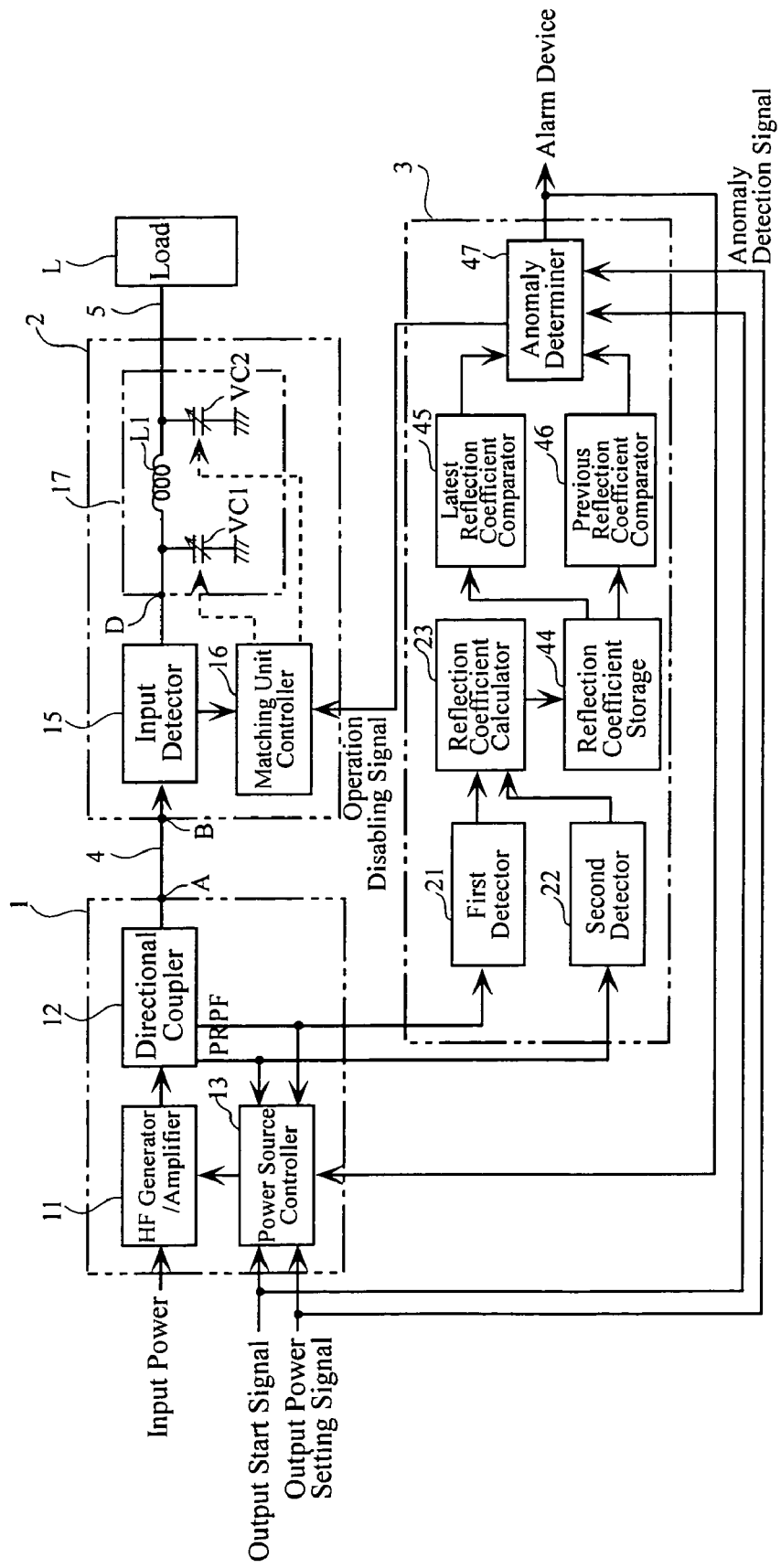
FIG. 22 shows a configuration of a high-frequency power supply system according to Embodiment 13 of the present invention.
Figure 23:
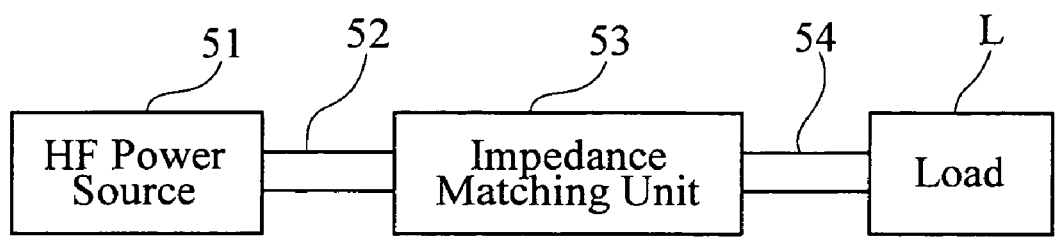
FIG. 23 shows a configuration of a conventional high-frequency power supply system.
Figure 24:
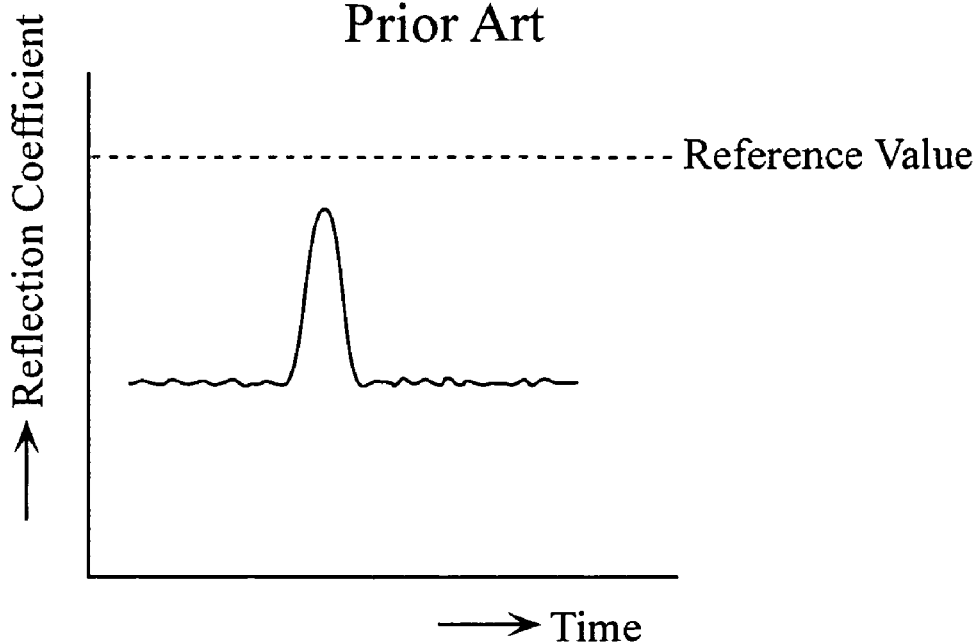
FIG. 24 shows a relationship between reflection coefficient and time in the conventional system.

FIG. 22 shows a configuration of a high-frequency power supply system according to Embodiment 13 of the present invention. In Embodiment 10, a logarithm of the reflection coefficient $\Gamma$ is obtained, and occurrence of anomalies is determined based on how this logarithm value changes per unit time. Embodiment 13 is an application of this idea to the method which is already described for Embodiment 1 and so on, where the reflection coefficient $\Gamma$ is utilized. Specifically, the high-frequency power supply system according to Embodiment 13 is the same as shown in FIG. 17, with the anomaly detector 3 having the following configuration:

Namely, the anomaly detector 3 according to Embodiment 13 includes a first detector 21, a second detector 22, a reflection coefficient calculator 23, a reflection coefficient storage 44, a latest-reflection-coefficient-value comparator 45, a previous-reflection-coefficient-value comparator 46 and an anomaly determiner 47.

The first detector 21, the second detector 22 and the reflection coefficient calculator 23 are identical with those in Embodiment 1 and therefore will not be described here. The reflection coefficient storage 44, the latest-reflection-coefficient-value comparator 45, the previous-reflection-coefficient-value comparator 46 and the anomaly determiner 47 are the logarithmic reflection coefficient storage 38, the logarithmic latest value comparator 39, the logarithmic previous value comparator 40 and the anomaly determiner 41 respectively in Embodiment 10 as they are applied to processing of the reflection coefficient Γ. The arrangement described above offers anomaly determination based on change in the reflection coefficient Γ per unit time just the same way as described for Embodiment 1, enabling to benefit from the same advantages as described for Embodiment 1.

The configuration in Embodiment 13 may further include, as in Embodiment 11, use of the differential value dZ/dt of the impedance Z in anomaly occurrence determination. Further, the configuration in Embodiment 13 may include, as in Embodiment 12, a counter for counting the number of abnormal events so that anomaly occurrence is determined when the number of events has exceeded a predetermined number.

In all of Embodiment 1 through Embodiment 13, power output from the high-frequency power source 1 is turned to zero upon detection of an anomaly. Alternatively, the power output may be decreased. For example, the output power may be halved. This also can decrease the potential spread of damage which has happened in the route from the outputting end A of the high-frequency power source 1 toward the load L to a maximum possible degree, enabling to prevent devices (not shown) in the high-frequency power source 1 from being damaged by overvoltage or overcurrent caused by the reflected wave power.

It should also be noted here that the directional coupler 12 may be provided between the outputting end A of the high-frequency power source 1 and the inputting end D of the matching section 17 of the impedance matching unit 2.

The scope of the present invention is not limited by the above-described embodiments. Specific construction of the components in the high-frequency power supply system according to the present invention may be varied in many different ways.

The invention claimed is:

1. A high-frequency power supply system for supplying high-frequency power from a high-frequency power source to a load via an impedance matching unit, the system comprising:
    a first detector for detecting information about a forward wave traveling from the high-frequency power source toward the load;
    a second detector for detecting information about a reflected wave traveling from the load toward the high-frequency power source;
    a differentiator for calculating a change of a magnitude of reflection coefficient per unit time at a detection point provided for the first and second detectors based on the information about the forward wave detected by the first detector and the information about the reflected wave detected by the second detector;
    an anomaly determiner for determining an occurrence of an anomaly on a side toward the load as from the detection point provided for the first and second detectors based on the change of the magnitude of reflection coefficient per unit time calculated by the differentiator; and
    a determination prevention unit for preventing the anomaly determiner from performing a determining operation upon commencement of a power supply operation of the high-frequency power source or upon a change made on an output power value setting during the power supply operation, until a predetermined time period has passed.

2. The high-frequency power supply system according to claim 1, wherein the anomaly determiner determines the occurrence of an anomaly when the change of the magnitude of reflection coefficient per unit time exceeds a first predetermined reference value.

3. The high-frequency power supply system according to claim 1, wherein the anomaly determiner includes a counter for counting the number of times when the change of the magnitude of reflection coefficient per unit time exceeds a first predetermined reference value, and determines the occurrence of an anomaly when the number of times counted by the counter exceeds a predetermined norm number.

4. The high-frequency power supply system according to claim 1, further comprising a calculator for calculating a magnitude of reflection coefficient at the detection point provided for the first and second detectors based on the information about the forward wave detected by the first detector and the information about the reflected wave detected by the second detector,
    wherein the anomaly determiner determines the occurrence of an anomaly on the side toward the load as from the detection point of the first and second detectors based on the change of the magnitude of reflection coefficient per unit time calculated by the differentiator and the magnitude of reflection coefficient calculated by the calculator.

5. The high-frequency power supply system according to claim 4, wherein the anomaly determiner determines the occurrence of an anomaly when the magnitude of reflection coefficient exceeds a second predetermined reference value and the change of the magnitude of reflection coefficient per unit time exceeds a first predetermined reference value.

6. The high-frequency power supply system according to claim 4, wherein the anomaly determiner includes: a first counter for counting the number of times when the change of the magnitude of reflection coefficient per unit time exceeds a first predetermined reference value; and a second counter for counting the number of times when the magnitude of reflection coefficient exceeds a second predetermined reference value; and determines the occurrence of an anomaly when the number of times counted by the first counter exceeds a first predetermined norm number and the number of times counted by the second counter exceeds a second predetermined norm number.

7. The high-frequency power supply system according to claim 1, wherein the detection point provided for the first and second detectors is inside the high-frequency power source, in a transmission line from a high-frequency power outputting end of the high-frequency power source to a high-frequency power inputting end of the impedance matching unit, or inside the impedance matching unit.

8. The high-frequency power supply system according to claim 1, further comprising an output power changer for changing an electric power outputted from the high-frequency power source in a decreasing direction upon detection of the occurrence of an anomaly by the anomaly detector.

9. The high-frequency power supply system according to claim 8, wherein the output power changer zeroes the electric power outputted from the high-frequency power source upon detection of the occurrence of an anomaly by the anomaly detector.

10. The high-frequency power supply system according to claim 8, further comprising an output power resumption unit for bringing the electric power outputted from the high-frequency power source back to an original amount after a lapse of a first predetermined time from the change made by the output power changer on the output power.

11. The high-frequency power supply system according to claim 10, further comprising a matching operation stopping unit for stopping a matching operation performed by the impedance matching unit and holding operation parameters upon the change made by the output power changer on the output power from the high-frequency power source.

12. The high-frequency power supply system according to claim 10, wherein the determination prevention unit prevents the anomaly determiner from performing a determining operation upon determination of the occurrence of an anomaly by the determiner, throughout a period of time while the output power changer changes the power output from the high-frequency power source and the output power resumption unit brings the power output back to the original amount, and further until the predetermined time period has passed.

13. The high-frequency power supply system according to claim 12, wherein the predetermined time period is longer than a time for the impedance matching unit to perform impedance matching between the high-frequency power source and the load.

14. The high-frequency power supply system according to claim 1, wherein the information detected by the first detector is a power value of the forward wave and the information detected by the second detector is a power value of the reflected wave.

15. The high-frequency power supply system according to claim 1, wherein the information detected by the first detector is a voltage value of the forward wave and the information detected by the second detector is a voltage value of the reflected wave.

16. A high-frequency power supply system for supplying high-frequency power from a high-frequency power source to a load via an impedance matching unit, the system comprising:
a first detector for detecting information about a forward wave traveling from the high-frequency power source toward the load;
a second detector for detecting information about a reflected wave traveling from the load toward the high-frequency power source;
a first differentiator for calculating a change per unit time of a magnitude of reflection coefficient at a detection point provided for the first and second detectors based on the information about the forward wave detected by the first detector and the information about the reflected wave detected by the second detector,
a third detector for detecting an input voltage to the load;
fourth detector for detecting an input current to the load;
a second differentiator for calculating a change of a magnitude of impedance per unit time as viewed from a detection point provided for the third and fourth detectors toward the load based on the input voltage detected by the third detector and the input current detected by the fourth detector;
an anomaly determiner for determining an occurrence of an anomaly on a side toward the load as from the detection point provided for the third and fourth detectors based on the change of the magnitude of reflection coefficient per unit time calculated by the first differentiator and the change of the magnitude of impedance per unit time calculated by the second differentiator;
a determination prevention unit for preventing the anomaly determiner from performing a determining operation upon commencement of a power supply operation of the high-frequency power source or upon a change made on an output power value setting during the power supply operation, until a predetermined time period has passed.

17. The high-frequency power supply system according to claim 16, wherein the anomaly determiner determines the occurrence of an anomaly when the change of the magnitude of reflection coefficient per unit time exceeds a first predetermined reference value and the change of the magnitude of impedance per unit time exceeds a third predetermined reference value.

18. The high-frequency power supply system according to claim 16, wherein the anomaly determiner includes:
a first counter for counting the number of times when the change of the magnitude of reflection coefficient per unit time exceeds a first predetermined reference value;
a third counter for counting the number of times when the change of the magnitude of impedance per unit time exceeds a third predetermined reference value; and
wherein the anomaly determiner determines the occurrence of an anomaly when the number of times counted by the first counter exceeds a first predetermined norm number and the number of times counted by the third counter exceeds a third predetermined norm number.

19. The high-frequency power supply system according to claim 16, further comprising a calculator for calculating a magnitude of reflection coefficient at the detection point provided for the first and the second detectors based on the information about the forward wave detected by the first detector and the information about the reflected wave detected by the second detector;
wherein the anomaly determiner determines the occurrence of an anomaly on the side toward the load as from the detection point of the third and fourth detectors based on the change of the magnitude of reflection coefficient per unit time calculated by the first differentiator, the magnitude of reflection coefficient calculated by the calculator and the change of the magnitude of impedance per unit time calculated by the second differentiator.

20. The high-frequency power supply system according to claim 19, wherein the anomaly determiner determines the occurrence of an anomaly when the change of the magnitude of reflection coefficient per unit time exceeds a first predetermined reference value, the magnitude of reflection coefficient exceeds a second predetermined reference value and the change of the magnitude of impedance per unit time exceeds a third predetermined reference value.

21. The high-frequency power supply system according to claim 19, wherein the anomaly determiner includes:
a first counter for counting the number of times when the change of the magnitude of reflection coefficient per unit time exceeds a first predetermined reference value;
a second counter for counting the number of times when the magnitude of reflection coefficient exceeds a second predetermined reference value; and
a third counter for counting the number of times when the change of the magnitude of impedance per unit time exceeds a third predetermined reference value; and
wherein the anomaly determiner determines the occurrence of an anomaly when the number of times counted by the first counter exceeds a first predetermined norm number, the number of times counted by the second counter exceeds a second predetermined norm number and the number of times counted by the third counter exceeds a third predetermined norm number.

22. The high-frequency power supply system according to claim 16, wherein the detection point provided for the first and the second detectors is inside the high-frequency power source, in a transmission line from a high-frequency power outputting end of the high-frequency power source to a high-frequency power inputting end of the impedance matching unit, or inside the impedance matching unit, the detection point provided for the third and the fourth detectors being in a transmission line from inside the impedance matching unit to the load.

23. The high-frequency power supply system according to claim 16, further comprising an output power changer for changing an electric power outputted from the high-frequency power source in a decreasing direction upon detection of an occurrence of anomaly by the anomaly detector.

24. The high-frequency power supply system according to claim 16, wherein the information detected by the first detector is a power value of the forward wave and the information detected by the second detector is a power value of the reflected wave.

25. The high-frequency power supply system according to claim 16, wherein the information detected by the first detector is a voltage value of the forward wave and the information detected by the second detector is a voltage value of the reflected wave.

26. A high-frequency power supply system for supplying high-frequency power from a high-frequency power source to a load via an impedance matching unit, the system comprising:
   a first detector for detecting information about a forward wave traveling from the high-frequency power source toward the load;
   a second detector for detecting information about a reflected wave traveling from the load toward the high-frequency power source;
   an anomaly determiner for determining an occurrence of an anomaly on a side toward the load as from the detection point provided for the first and the second detector; and
   a determination prevention unit for preventing the anomaly determiner from performing a determining operation upon commencement of a power supply operation of the high-frequency power source or upon a change made on an output power value setting during the power supply operation, until a predetermined time period has passed.

27. The high-frequency power supply system according to claim 26, further comprising:
   a logarithmic reflection coefficient calculator for calculating a logarithm value of a reflection coefficient at a detection point provided for the first and second detectors based on the information about the forward wave detected by the first detector and the information about the reflected wave detected by the second detector;
   a logarithmic reflection coefficient storage for storing the reflection coefficient logarithm value calculated by the logarithmic reflection coefficient calculator in succession at a predetermined time interval; and
   wherein the anomaly determiner determines the occurrence of an anomaly when a latest value stored in the logarithmic reflection coefficient storage is not smaller than a first predetermined reference value and a previous value stored in the logarithmic reflection coefficient storage is not greater than a second predetermined reference value.

28. The high-frequency power supply system according to claim 26, further comprising:
   a logarithmic reflection coefficient calculator for calculating a logarithm value of a reflection coefficient at a detection point provided for the first and second detectors based on the information about the forward wave detected by the first detector and the information about the reflected wave detected by the second detector;
   a logarithmic reflection coefficient storage for storing the reflection coefficient logarithm value calculated by the logarithmic reflection coefficient calculator in succession at a predetermined time interval; and
   wherein the anomaly determiner includes a counter for counting the number of times when a latest value stored in the logarithmic reflection coefficient storage is not smaller than a first predetermined reference value and a previous value stored in the logarithmic reflection coefficient storage is not greater than a second predetermined reference value, and determines the occurrence of an anomaly when the number of times counted by the fourth counter exceeds a predetermined norm number.

29. The high-frequency power supply system according to claim 26, wherein the detection point provided for the first and second detectors is inside the high-frequency power source, in a transmission line from a high-frequency power outputting end of the high-frequency power source to a high-frequency power inputting end of the impedance matching unit, or inside the impedance matching unit.

30. The high-frequency power supply system according to claim 26, further comprising:
   a logarithmic reflection coefficient calculator for calculating a logarithm value of a magnitude of reflection coefficient at a detection point provided for the first and the second detectors based on the information about the forward wave detected by the first detector and the information about the reflected wave detected by the second detector;
   a logarithmic reflection coefficient storage for storing the reflection coefficient logarithm value calculated by the logarithmic reflection coefficient calculator in succession at a predetermined time interval;
   a third detector for detecting an input voltage to the load;
   a fourth detector for detecting an input current to the load; and
   a second differentiator for calculating a change of a magnitude of impedance per unit time as viewed from a detection point provided for the third and the fourth detector toward the load based on the input voltage detected by the third detector and the input current detected by the fourth detector;
   wherein the anomaly determiner determines the occurrence of an anomaly on a side toward the load as from the detection point provided for the third and fourth detectors based on a latest value and a previous value stored in the logarithmic reflection coefficient storage, and the change of the magnitude of impedance per unit time calculated by the second differentiator.

31. The high-frequency power supply system according to claim 30, wherein the anomaly determiner determines the occurrence of an anomaly, when the latest value stored in the logarithmic reflection coefficient storage is not smaller than a fourth predetermined reference value, the previous value stored in the logarithmic reflection coefficient storage is not greater than a fifth predetermined reference value and the change of the magnitude of impedance per unit time exceeds a third predetermined reference value.

32. The high-frequency power supply system according to claim 30, wherein the anomaly determiner includes: a first counter for counting the number of times when the latest value stored in the logarithmic reflection coefficient storage is not smaller than a first predetermined reference value and the previous value stored in the logarithmic reflection coefficient storage is not greater than a second predetermined reference value; and a third counter for counting the number of times when the change of the magnitude of impedance per unit time exceeds a third predetermined reference value; and wherein the anomaly determiner determines the occurrence of an anomaly when the number of times counted by the first counter exceeds a first predetermined norm number and the number of times counted by the third counter exceeds a second predetermined norm number.

33. The high-frequency power supply system according to claim 30, wherein the detection point provided for the first and the second detector is inside the high-frequency power source, in a transmission line from a high-frequency power outputting end of the high-frequency power source to a high-frequency power inputting end of the impedance matching unit, or inside the impedance matching unit, the detection point provided for the third and the fourth detector being in a transmission line from inside the impedance matching unit to the load.

34. The high-frequency power supply system according to claim 26, further comprising:
a reflection coefficient calculator for calculating a magnitude of reflection coefficient at a detection point provided for the first and second detectors based on the information about the forward wave detected by the first detector and the information about the reflected wave detected by the second detector; and
a reflection coefficient storage for storing the reflection coefficient value calculated by the reflection coefficient calculator in succession at a predetermined time interval;
wherein the anomaly determiner determines the occurrence of an anomaly on a side toward the load as from the detection point provided for the first and second detectors based on the latest value and the previous value stored in the reflection coefficient storage.

35. The high-frequency power supply system according to claim 34, wherein the anomaly determiner determines the occurrence of an anomaly when a latest value stored in the reflection coefficient storage is not smaller than a first predetermined reference value and a previous value stored in the reflection coefficient storage is not greater than a second predetermined reference value.

36. The high-frequency power supply system according to claim 34, wherein the anomaly determiner includes a counter for counting the number of times when a latest value stored in the reflection coefficient storage is not smaller than a first predetermined reference value and a previous value stored in the reflection coefficient storage is not greater than a second predetermined reference value, and determines the occurrence of an anomaly when the number of times counted by the counter exceeds a predetermined norm number.

37. The high-frequency power supply system according to claim 34, wherein the detection point provided for the first and second detectors is inside the high-frequency power source, in a transmission line from a high-frequency power outputting end of the high-frequency power source to a high-frequency power inputting end of the impedance matching unit or inside the impedance matching unit.

38. The high-frequency power supply system according to claim 26, further comprising:
a reflection coefficient calculator for calculating a magnitude of reflection coefficient at a detection point provided for the first and second detectors based on the information about the forward wave detected by the first detector and the information about the reflected wave detected by the second detector;
a reflection coefficient storage for storing the reflection coefficient value calculated by the reflection coefficient calculator in succession at a predetermined time interval;
a third detector for detecting an input voltage to the load;
a fourth detector for detecting an input current to the load; and
a differentiator for calculating a change per unit time of a magnitude of impedance as viewed from a detection point provided for the third and fourth detectors based on the input voltage detected by the third detector and the input current detected by the fourth detector;
wherein the anomaly determiner determines the occurrence of an anomaly on a side toward the load as from the detection point provided for the first and second detectors based on a latest value and a previous value stored in the reflection coefficient storage, and the change of the magnitude of impedance per unit time calculated by the second differentiator.

39. The high-frequency power supply system according to claim 38, wherein the anomaly determiner determines the occurrence of an anomaly when the latest value stored in the reflection coefficient storage is not smaller than a first predetermined reference value, the previous value stored in the reflection coefficient storage is not greater than a second predetermined reference value and the change of the magnitude of impedance per unit time exceeds a third predetermined reference value.

40. The high-frequency power supply system according to claim 38, wherein the anomaly determiner includes: a first counter for counting the number of times when the latest value stored in the reflection coefficient storage is not smaller than a first predetermined reference value and the previous value stored in the reflection coefficient storage is not greater than a second predetermined reference value; and a second counter for counting the number of times when the change of the magnitude of impedance per unit time exceeds a third predetermined reference value; and determines the occurrence of an anomaly when the number of times counted by the first counter exceeds a first predetermined norm number and the number of times counted by the second counter exceeds a second predetermined norm number.

41. The high-frequency power supply system according to claim 38, wherein the detection point provided for the first and second detectors is inside the high-frequency power source, in a transmission line from a high-frequency power outputting end of the high-frequency power source to a high-frequency power inputting end of the impedance matching unit or inside the impedance matching unit, the detection point provided for the third and the fourth detector being in a transmission line from inside the impedance matching unit to the load.

42. The high-frequency power supply system according to claim 26, further comprising an output power changer for changing an electric power outputted from the high-frequency power source in a decreasing direction upon detection of an occurrence of an anomaly by the anomaly detector.

43. The high-frequency power supply system according to claim 26, wherein the information detected by the first detector is a power value of the forward wave and the information detected by the second detector is a power value of the reflected wave.

44. The high-frequency power supply system according to claim 26, wherein the information detected by the first detector is a voltage value of the forward wave and the information detected by the second detector is a voltage value of the reflected wave.

* * * * *